(12) United States Patent
Hong et al.

(10) Patent No.: US 10,285,263 B2
(45) Date of Patent: May 7, 2019

(54) FLEXIBLE CIRCUIT BOARD AND ELECTRONIC DEVICE INCLUDING THE SAME

(71) Applicant: Samsung Display Co., Ltd., Yongin (KR)

(72) Inventors: Jong Ho Hong, Yongin-si (KR); Hye Jin Joo, Suwon-si (KR); Won Il Choi, Ansan-si (KR); Soon Sung Ahn, Cheonan-si (KR); Hyoung Wook Jang, Anyang-si (KR)

(73) Assignee: Samsung Display Co., Ltd., Yongin (KR)

( * ) Notice: Subject to any disclaimer, the term of this patent is extended or adjusted under 35 U.S.C. 154(b) by 613 days.

(21) Appl. No.: 14/601,947

(22) Filed: Jan. 21, 2015

(65) Prior Publication Data

US 2016/0066411 A1    Mar. 3, 2016

(30) Foreign Application Priority Data

Sep. 3, 2014    (KR) .................... 10-2014-0116955

(51) Int. Cl.
*H05K 1/02*    (2006.01)
*G06F 3/044*    (2006.01)

(52) U.S. Cl.
CPC ............ *H05K 1/028* (2013.01); *G06F 3/044* (2013.01); *H05K 1/0271* (2013.01); *H05K 1/0283* (2013.01); *G06F 2203/04102* (2013.01); *G06F 2203/04106* (2013.01); *H05K 2201/051* (2013.01); *H05K 2201/09227* (2013.01); *H05K 2201/09263* (2013.01); *H05K 2201/09272* (2013.01)

(58) Field of Classification Search
CPC ............ G06F 2203/04102; G06F 2203/04106; H05K 1/028; H05K 1/0283; H05K 2201/09272
USPC ............................................. 174/250
See application file for complete search history.

(56) References Cited

U.S. PATENT DOCUMENTS

| | | | |
|---|---|---|---|
| 6,188,391 B1 * | 2/2001 | Seely .................. | G06F 3/044 178/18.03 |
| 6,879,096 B1 * | 4/2005 | Miyazaki ............ | G09G 3/2011 313/292 |
| 8,207,473 B2 | 6/2012 | Axisa et al. | |
| 8,384,096 B2 | 2/2013 | Herrmann | |
| 9,256,311 B2 | 2/2016 | Yilmaz et al. | |
| 2009/0033856 A1 * | 2/2009 | Kiryuschev .......... | G06F 3/1446 349/150 |
| 2012/0052268 A1 | 3/2012 | Axisa et al. | |

(Continued)

FOREIGN PATENT DOCUMENTS

| CN | 101796636 | 8/2010 |
|---|---|---|
| CN | 103092441 | 5/2013 |

(Continued)

*Primary Examiner* — Timothy J Thompson
*Assistant Examiner* — Rhadames Alonzo Miller
(74) *Attorney, Agent, or Firm* — H.C. Park & Associates, PLC

(57) ABSTRACT

A circuit board includes a substrate and conductive patterns disposed inside or on the substrate, in which two neighboring conductive patterns are separated from each other by a gap disposed therebetween, and the conductive pattern includes first cut patterns connected to the gap and disposed toward an inside of the conductive pattern.

20 Claims, 30 Drawing Sheets

(56) References Cited

U.S. PATENT DOCUMENTS

| | | | | |
|---|---|---|---|---|
| 2013/0021289 A1* | 1/2013 | Chen | ............... | G06F 1/1601 |
| | | | | 345/174 |
| 2013/0106441 A1* | 5/2013 | Yilmaz | ............ | G06F 3/0414 |
| | | | | 324/658 |
| 2014/0035869 A1 | 2/2014 | Yun et al. | | |
| 2014/0231121 A1* | 8/2014 | Pai | ................ | H05K 1/0224 |
| | | | | 174/254 |
| 2014/0340597 A1* | 11/2014 | Sato | ............... | G02F 1/13338 |
| | | | | 349/12 |
| 2015/0069453 A1* | 3/2015 | Yamada | ............ | H01L 33/62 |
| | | | | 257/99 |

FOREIGN PATENT DOCUMENTS

| | | | | |
|---|---|---|---|---|
| CN | 103596355 | | 2/2014 | |
| JP | 2015056535 A | * | 3/2015 | ............ H01L 33/62 |
| KR | 1020060042723 | | 5/2006 | |
| KR | 1020120095019 | | 8/2012 | |
| KR | 1020130043526 | | 4/2013 | |

\* cited by examiner

FLEXIBLE CIRCUIT BOARD AND ELECTRONIC DEVICE INCLUDING THE SAME

CROSS-REFERENCE TO RELATED APPLICATION

This application claims priority from and the benefit of Korean Patent Application No. 10-2014-0116955, filed on Sep. 3, 2014, which is hereby incorporated by reference for all purposes as if fully set forth herein.

BACKGROUND

Field

Exemplary embodiments of the present invention relate to a circuit board and an electronic device including the same. More particularly, exemplary embodiments of the present invention relate to a flexible circuit board and an electronic device including the same.

Discussion of the Background

Flexible electronic devices may include a portion that is foldable, rollable, or stretchable in at least one direction, or an elastic portion that may be deformed. The flexible electronic device may include a flexible circuit board including a flexible substrate and a conductive layer provided on one side of the flexible substrate. Accordingly, when the flexible electronic device is folded, rolled, or stretched in at least one direction, the applied stress may deform the flexible electronic device if the flexible circuit board is not specifically provided on a neutral plane.

Techniques for utilizing contact between a user's finger or a pen to an electronic device as an input device without additional means, such as a keyboard, have recently been developed. A touch panel may be a panel including a sensor that implements a touch sensing function. Touch sensing function may be used for display devices, and a circuit board including conductive patterns may be used to implement the touch panel. When the flexible electronic device has a touch sensing function, the flexible electronic device may include a flexible circuit board.

The touch sensing function may require high precision. That is, a sensor implementing the touch sensing function may be required to obtain detailed information of a point touched by the user. Particularly, with the development of high resolution display devices, there may be an increased need for a display device sensor with precise touch-recognition of a detailed change of the user's touching position.

When the flexible circuit board receives unbearable stress, or is deformed more than a number of times, a conductive layer of the flexible circuit board may be stripped off or crack, which lowers the reliability of the flexible electronic device. Particularly, when the flexible electronic device is a display device including a sensor with a flexible circuit board, the sensor arranged near an external side of the display device may receive substantial stress when the display device is folded or rolled. Accordingly, the circuit board of the sensor may deteriorate from repeated or substantial deformation of the flexible display device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a flexible circuit board with improved elasticity to prevent deterioration from repeated deformation, and to improve reliability.

Exemplary embodiments of the present invention also provide a flexible electronic device including a flexible circuit board with improved elasticity.

Additional aspects will be set forth in the detailed description which follows, and, in part, will be apparent from the disclosure, or may be learned by practice of the inventive concept.

According to an exemplary embodiment of the present invention, a circuit board includes a substrate, and conductive patterns disposed inside or on the substrate, in which the two neighboring conductive patterns are separated from each other by a gap disposed therebetween, and the conductive pattern includes first cut patterns connected to the gap and disposed toward an inside of the conductive pattern.

The gap may extend substantially in a first direction, and the first cut patterns may be respectively arranged along the first direction.

The first cut pattern may extend in an oblique direction with respect to a second direction perpendicular to the first direction.

At least a portion of the two neighboring first cut patterns may overlap each other in the first direction.

The substrate may include substrate cut patterns corresponding to the first cut patterns.

The substrate may further include a substrate gap cut pattern corresponding to the gap.

The conductive pattern may further include a main body extending in a first direction and sub-bodies connected to the main body, the first direction being a direction along which the gap substantially extends.

The first cut patterns may be connected to an apex of the gap, the apex being a closest point to the main body from the gap.

The conductive pattern may further include a second cut pattern connected to a first cut pattern of the first cut patterns or disposed near the first cut pattern.

The second cut pattern may include a hole disposed at an end portion of the first cut pattern.

The second cut pattern may include a side cut pattern disposed near the first cut pattern and connected to a second cut pattern of the neighboring conductive pattern.

According to an exemplary embodiment of the present invention, an electronic device may include a first circuit board and a second circuit board facing each other, and an elastic layer disposed between the first circuit board and the second circuit board, in which the first circuit board includes a first substrate and first conductive patterns disposed inside or on the first substrate, two neighboring first conductive patterns are separated from each other by a first gap disposed therebetween, and the first conductive pattern includes first cut patterns connected to the first gap and disposed toward an inside of the first conductive pattern.

The first gap may extend substantially in a first direction, and the first cut patterns may be arranged along the first direction.

The first substrate may include substrate cut patterns corresponding to the first cut patterns.

The first substrate may further include a substrate gap cut pattern corresponding to the first gap.

The second circuit board may include a second substrate and second conductive patterns disposed inside or on the second substrate, two neighboring second conductive patterns are separated from each other by a second gap disposed therebetween, and the first conductive pattern extends in a direction substantially orthogonal to a direction in which the second conductive pattern extends.

The second conductive pattern may include second cut patterns connected to the second gap and disposed toward an inside of the second conductive pattern.

The first conductive pattern may include a first main body extending substantially in a first direction and first sub-bodies connected to the first main body, the second conductive pattern may include a second main body extending substantially in a second direction and second sub-bodies connected to the second main body, and the first direction is substantially orthogonal to the second direction.

The first cut patterns may be connected to an apex of the first gap, the apex being a closest point to the main body from the first gap.

The electronic device may further include a second cut pattern connected to a first cut pattern of the first cut patterns or disposed near the first cut pattern.

According to the exemplary embodiments of the present invention, elasticity of the circuit board may be improved to prevent generation of faults from repeated deformation, and to improve reliability. Further, the flexible electronic device including a circuit board with high elasticity may maintain high reliability of the flexible electronic device from repeated deformation.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
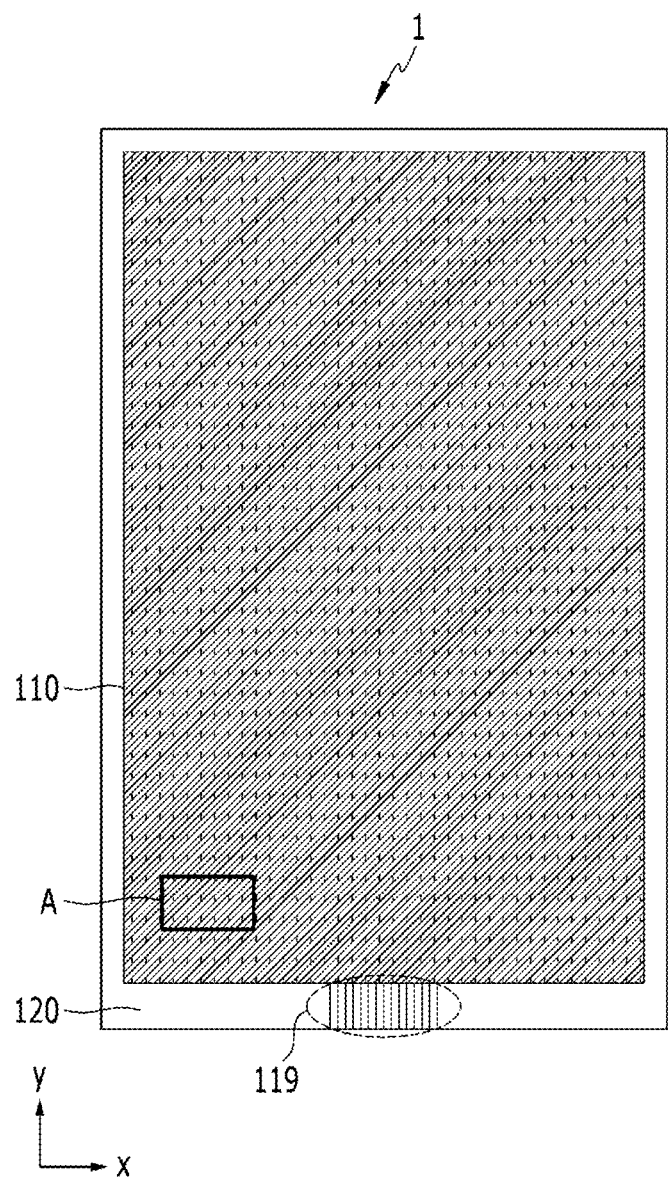
FIG. 1 shows a top plan view of a circuit board according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A circuit board according to an exemplary embodiment of the present invention will be described below with reference to FIG. 1 to FIG. 5.

Figure 2:
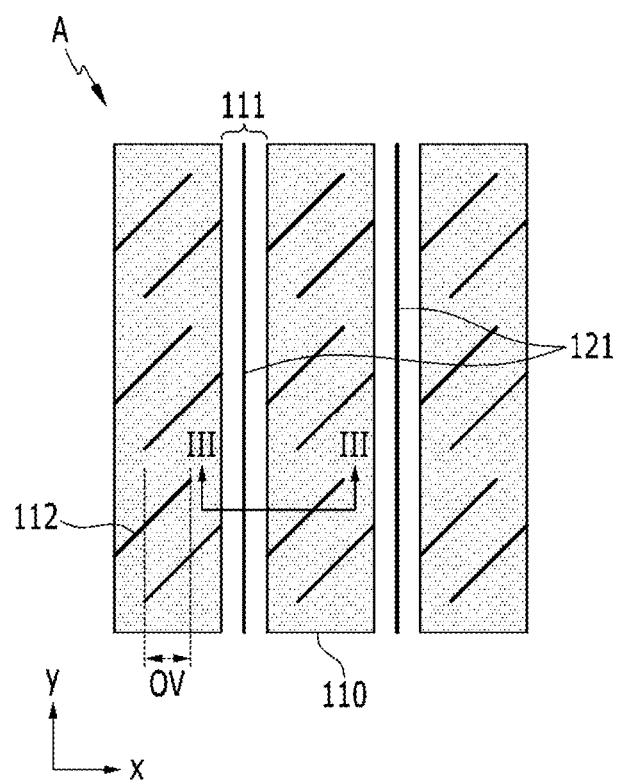
FIG. 2 shows an enlarged view of portion A of FIG. 1 before the circuit board shown in FIG. 1 is elongated.
Figure 3:
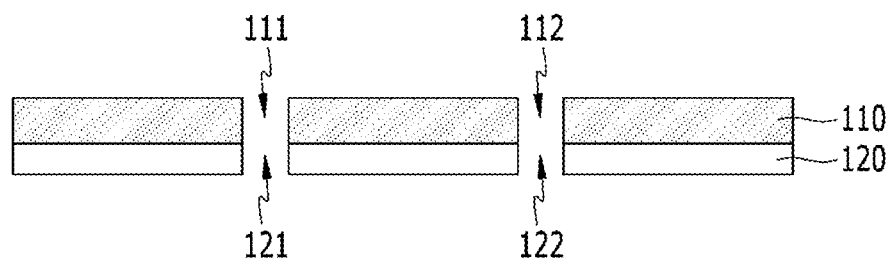
FIG. 3 shows a cross-sectional view of the circuit board of FIG. 2 with respect to line III-III.
Figure 4:
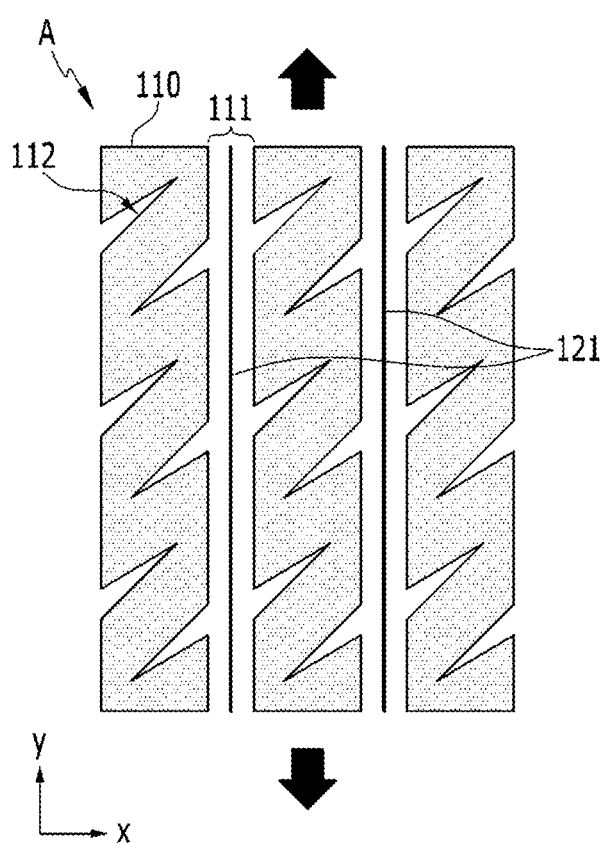
FIG. 4 shows a top plan view after the circuit board shown in FIG. 2 is elongated upwards and downwards.
Figure 5:
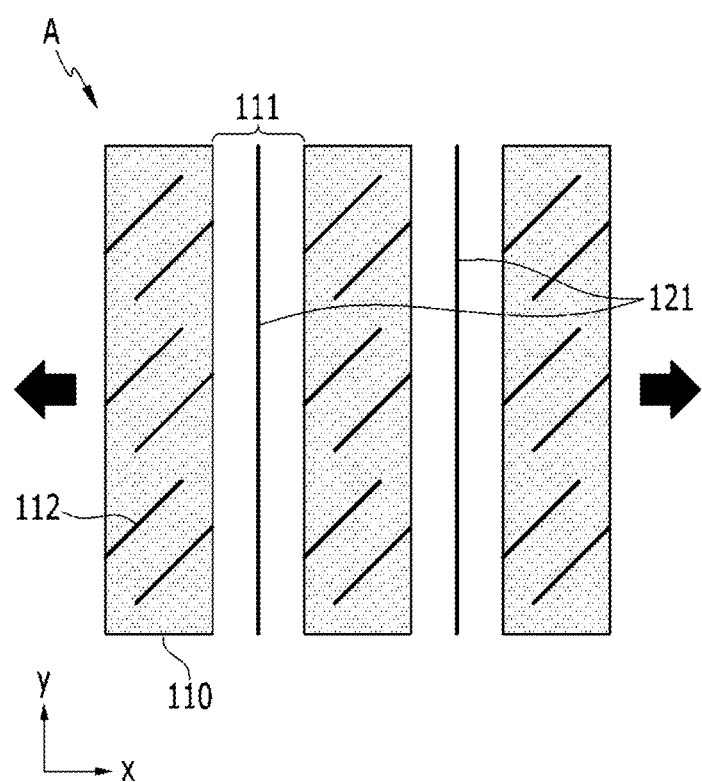
FIG. 5 shows a top plan view after the circuit board shown in FIG. 2 is elongated to the right and left.

FIG. 1 shows a top plan view of a circuit board 1 according to an exemplary embodiment of the present invention, FIG. 2 shows an enlarged view of portion A before the circuit board 1 shown in FIG. 1 is elongated, FIG. 3 shows a cross-sectional view of the circuit board 1 of FIG. 2 with respect to line III-III, FIG. 4 shows a top plan view after the circuit board 1 shown in FIG. 2 is elongated upwards and downwards, and FIG. 5 shows a top plan view after the circuit board 1 shown in FIG. 2 is elongated to the right and left.

Referring to FIG. 1, the circuit board 1 may be a flexible circuit board including conductive patterns 110 and a substrate 120.

The substrate 120 may be flexible and insulated. The substrate 120 may include a polymer, such as a polyimide. The substrate 120 may be formed of a film or films.

The conductive pattern 110 may be formed inside or on the substrate 120. The conductive pattern 110 may include a conductive material, such as metals of gold, silver, copper, aluminum, alloys thereof, and a transparent conductive material.

The conductive pattern 110 may form an electrode or a wire. The conductive pattern 110 may include a pad 119 for accessing a driving circuit chip or another circuit board.

Flexible electronic devices, such as a flexible display device and a flexible sensor, may include the circuit board 1.

Referring to FIG. 2 and FIG. 3, the conductive patterns 110 are arranged in an x-axis direction, and the conductive patterns 110 are extended in a y-axis direction. A gap 111 is disposed between the neighboring conductive patterns 110. The substrate 120 includes a substrate gap cut pattern 121 that corresponds to the gap 111 disposed between neighboring conductive patterns 110. A width of the substrate gap cut pattern 121 may be less than or equal to the gap 111. According to an exemplary embodiment illustrated with respect to FIG. 2, the width of the substrate gap cut pattern 121 is less than a width of the gap 111. According to an exemplary embodiment illustrated with respect to FIG. 3, the width of the substrate gap cut pattern 121 is substantially equal to the width of the gap 111.

The conductive pattern 110 includes sides that face a side of a neighboring conductive pattern 110, and the sides extend substantially in the y-axis direction.

The conductive pattern 110 includes cut patterns 112, and the substrate 120 includes a substrate cut pattern 122 that corresponds to the cut pattern 112 of the conductive pattern 110. A width of the substrate cut pattern 122 may be less than or equal to the width of the cut pattern 112.

The cut pattern 112 of the conductive pattern 110 and the substrate cut pattern 122 of the substrate 120 are formed so that they may be elongated when the circuit board 1 is pulled in the y-axis direction. For example, as shown in FIG. 2, cut patterns 112 formed on one conductive pattern 110 and the corresponding substrate cut patterns 122 of the substrate 120 are formed in one direction which may be oblique or substantially parallel to the x-axis direction. Since the conductive pattern 110 extends in the y-axis direction, cut pattern 112 and the substrate cut pattern 122 may not be formed to traverse the conductive pattern 110.

The cut pattern 112 and the substrate cut pattern 122 may also have a linear, curved, irregular, or serpentine shape.

The cut pattern 112 and the corresponding substrate cut pattern 122 formed along one side of the conductive pattern 110 may alternately be disposed with those formed along a side of the neighboring conductive pattern 110 facing each other in the y-axis direction.

Referring to FIG. 4, when the circuit board 1 is pulled in the y-axis direction, the cut pattern 112 and the substrate cut pattern 122 may be deformed, such as expanded or widened, to extend the conductive pattern 110 and the substrate 120 in the y-axis direction. Accordingly, the circuit board 1 may be substantially elongated without damaging the conductive pattern 110. The conductive pattern 110 and the corresponding substrate 120 may be deformed to bend with respect to the cut pattern 112 and the substrate cut pattern 122.

When the circuit board 1 is compressed in the y-axis direction, two portions of the conductive pattern 110 facing each other with respect to the cut pattern 112 and two portions of the substrate 120 facing each other with respect to the substrate cut pattern 122 may be deformed, such as being close to or overlapping each other, and the conductive pattern 110 and the substrate 120 may be compressed in the y-axis direction. Therefore, the circuit board 1 may be compressed without damaging the conductive pattern 110.

Referring back to FIG. 2, the cut pattern 112 and the corresponding substrate cut pattern 122 formed on the left side of the conductive pattern 110 may overlap with the cut pattern 112 and the corresponding substrate cut pattern 122 formed on the right side of the conductive pattern 110 in at least a part of the overlapping region (OV) in the y-axis direction. Accordingly, increasing the lengths of the cut pattern 112 and the substrate cut pattern 122 may increase a deformation rate, such as an elongation rate, of the circuit board 1, to further expand the circuit board 1 in the y-axis direction and prevent the conductive pattern 110 from being damaged.

Referring to FIG. 5, when the circuit board 1 is pulled in the x-axis direction, the gap 111 between the conductive patterns 110 and the substrate gap cut pattern 121 of the substrate 120 may increase, and the circuit board 1 may be elongated in the x-axis direction. When the circuit board 1 is compressed in the x-axis direction, the gap 111 between the conductive patterns 110 and the substrate gap cut pattern 121 of the substrate 120 may be reduced, or the two portions of the conductive patterns 110 or the two portions of the substrate 120 facing each other with respect to the gap 111 may deform, such as being closer or overlapping each other, so the circuit board 1 is compressed in the x-axis direction.

When the circuit board 1 is pulled or compressed in an oblique direction that is different from the x-axis direction and the y-axis direction, the gap 111 of the conductive pattern 110, the cut pattern 112, the substrate gap cut pattern 121, and the substrate cut pattern 122 of the substrate 120 may deform, such as being widened or narrowed, to elongate or compress the circuit board 1.

The circuit board 1 according to an exemplary embodiment of the present invention may be elongated or compressed in at least two directions (x-axis and y-axis) without damaging the conductive pattern 110. Accordingly, the circuit board 1 applied to flexible electronic devices such as the flexible panel, may prevent the device from generating faults, such as stripping off or cracking of the conductive pattern 110, and increase the reliability of the circuit board 1 and the electronic device. Particularly, when the circuit board 1 is provided at a location where the flexible electronic device may be bent, folded, rolled, or stretched, the flexible electronic device may withstand the deformation force and increase the reliability of products. The reliability on the products may further be increased by increasing the deformation rate, such as an elongation rate, while substantially maintaining a fill factor of the conductive patterns 110.

Although not shown, the circuit board 1 may further include a cover-lay disposed on the conductive pattern 110 and the substrate 120, which protects the conductive pattern 110. The cover-lay may be a film type including a plastic material, such as polyimide, polyester, polyphenylene sulfate, polyester sulfone, polyethyl ketone, aramid, polycarbonate, or polyarylate. The cover-lay may be attached to the conductive pattern 110 and the substrate 120 through an adhesive layer (not shown).

The width of the conductive pattern 110 of the circuit board 1 may be less than or equal to a width of a portion that is divided by the substrate gap cut pattern 121 and the substrate cut pattern 122 to prevent the conductive pattern 110 from being stripped off, and the conductive pattern 110 that is not incised may be disposed in a region of the substrate 120 that is not incised.

The gap 111 of the conductive pattern 110, the cut pattern 112, the substrate gap cut pattern 121, and the substrate cut pattern 122 may be formed by various methods, such as photolithography-based patterning, molding, or laser punching.

The cut pattern 112 of the conductive pattern 110 and the corresponding substrate cut pattern 122 of the substrate 120 may be formed in the entire region of the circuit board 1, or in a part of a bent or folded region. When the cut pattern 112 and the substrate cut pattern 122 are formed in the entire region of the circuit board 1, the circuit board 1 or the electronic device including the circuit board 1 may prevent the circuit board 1 from being damaged when any part thereof is deformed, such as bent or folded.

Configurations of the gap 111 of the conductive pattern 110 and/or the cut pattern 112, and the substrate gap cut pattern 121 and/or the substrate cut pattern 122 may control the deformation rate, such as an elongation rate of the circuit board 1 or the electronic device including the circuit board 1. The configuration may include conditions such as shape, an angle, or an interval with respect to the x-axis or y-axis.

A circuit board 1 according to an exemplary embodiment of the present invention will be described below with reference to FIG. 6 to FIG. 10. Repeated description of the substantially similar elements and operations of the circuit board 1 illustrated with reference to FIG. 2 through FIG. 5 will be omitted.

Figure 6:
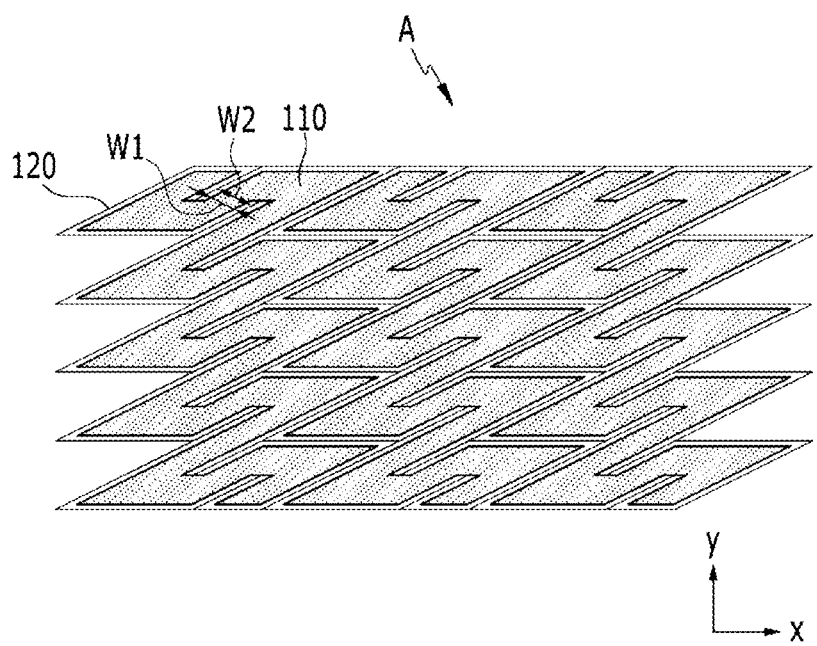
FIG. 6 shows an enlarged view of portion A of FIG. 1 before the circuit board shown in FIG. 1 is elongated.
Figure 7:
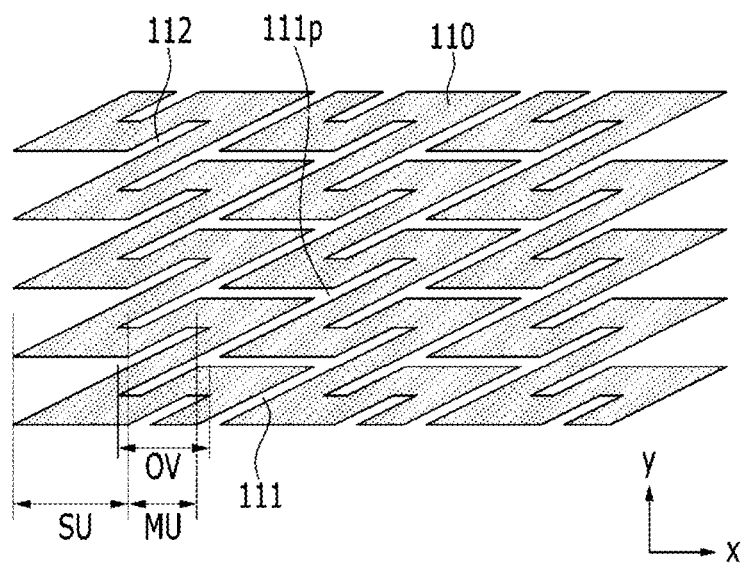
FIG. 7 shows an enlarged view of a conductive pattern of portion A of FIG. 1 before the circuit board shown in FIG. 1 is elongated.
Figure 8:
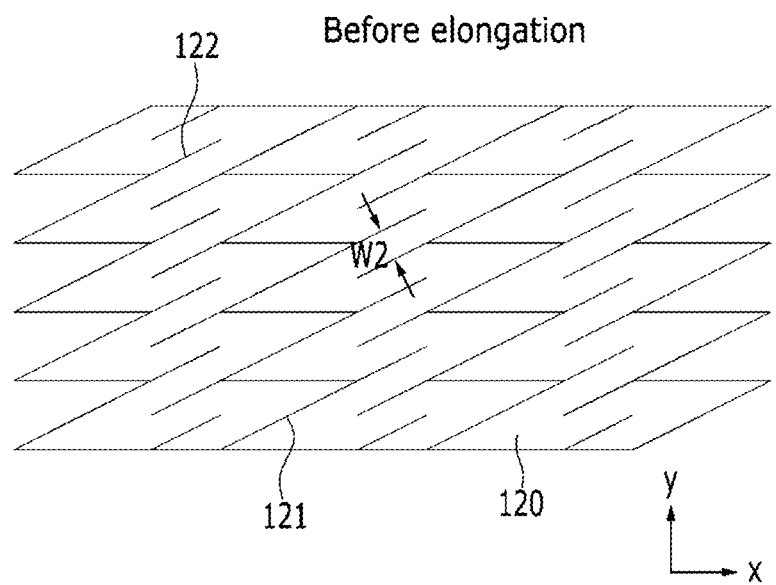
FIG. 8 shows an enlarged view of a substrate of portion A of FIG. 1 before the circuit board shown in FIG. 1 is elongated.
Figure 9:
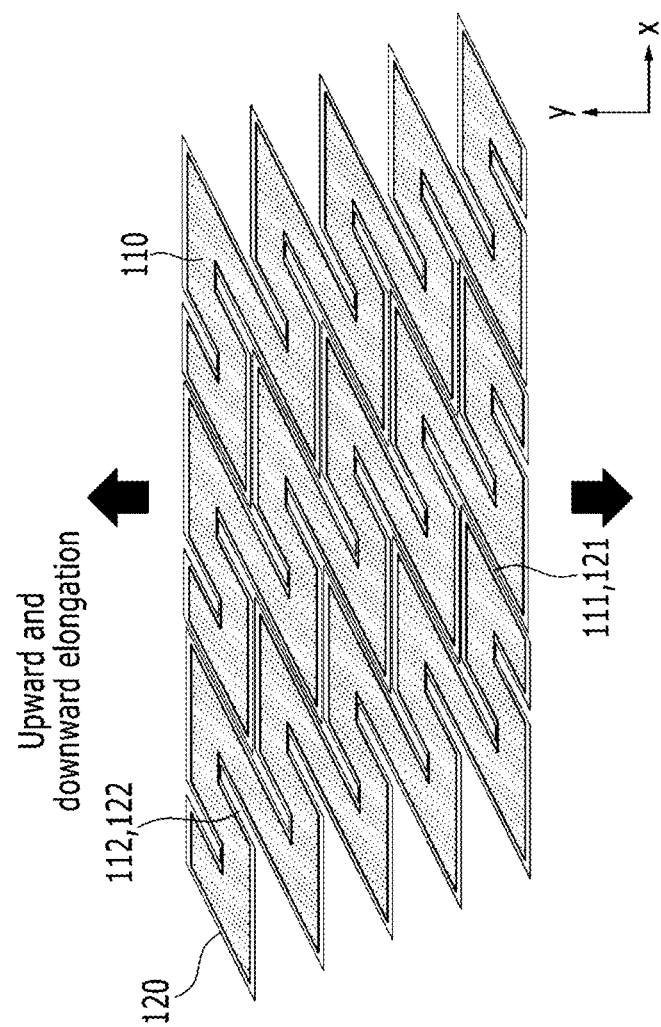
FIG. 9 shows an enlarged view of portion A of FIG. 1 after the circuit board shown in FIG. 1 is elongated upwards and downwards.
Figure 10:
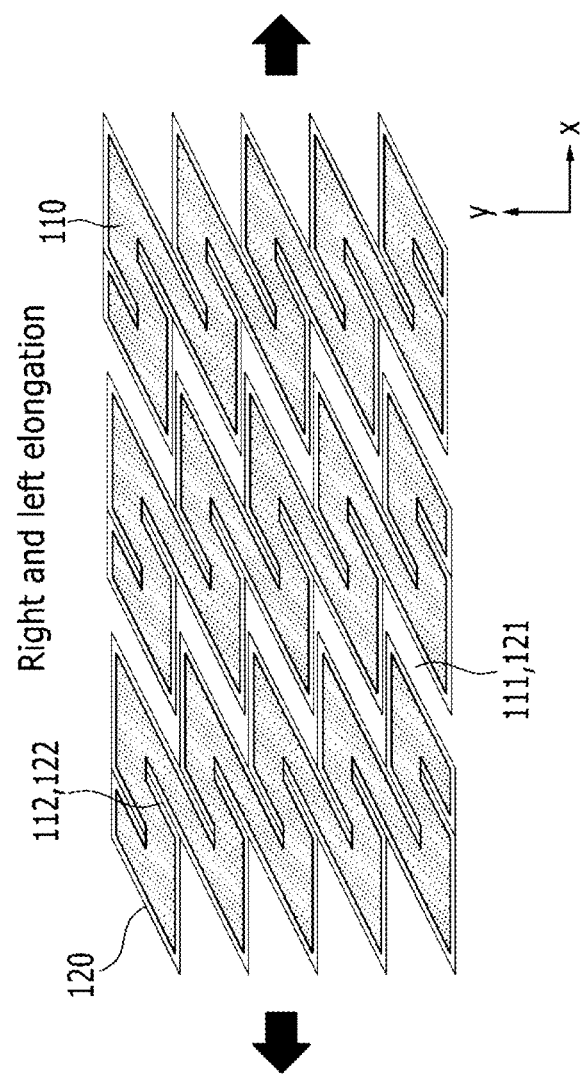
FIG. 10 shows an enlarged view of portion A of FIG. 1 after the circuit board shown in FIG. 1 is elongated to the right and left.

FIG. 6 shows an enlarged view of portion A of the circuit board 1 illustrated with reference to FIG. 1 before the circuit board 1 is elongated, FIG. 7 shows an enlarged view of a conductive pattern of portion A before the circuit board 1 is elongated, FIG. 8 shows an enlarged view of a substrate of portion A before the circuit board 1 is elongated, FIG. 9 shows an enlarged view of portion A after the circuit board 1 is elongated upwards and downwards, and FIG. 10 shows an enlarged view of portion A after the circuit board 1 is elongated to the right and left.

Referring to FIG. 6, the circuit board 1 includes conductive patterns 110 and a substrate 120.

Referring to FIG. 6 and FIG. 7 according to the present exemplary embodiment, the circuit board 1 includes the conductive pattern 110 which includes a main body (MU) extended in the y-axis direction and a sub-body (SU) disposed near the main body (MU) and connected to the main body (MU). The sub-body (SU) may protrude in the x-axis direction from the main body (MU). The width of the sub-body (SU) may be reduced as the sub-body (SU) is arranged distant from the main body (MU). For example, the sub-body (SU) may have a triangular shape or may include a curved side of which the width is reduced as the sub-body (SU) is arranged distant from the main body (MU).

The sub-bodies (SU) of the neighboring conductive patterns 110 are alternately arranged in the y-axis direction, and are disposed to be engaged with each other so the gaps 111 between the neighboring conductive patterns 110 may be substantially constant. Accordingly, the gaps 111 may be arranged alternately.

Referring to FIG. 7, the gap 111 between the conductive patterns 110 includes an apex 111p which is a point nearest to the main body (MU) from the gap 111.

As shown in FIG. 7, the conductive pattern 110 of the circuit board 1 includes a cut pattern 112 connected to the gap 111 and formed inside the main body (MU). The cut pattern 112 is formed so that it may be elongated when the circuit board 1 is pulled in the y-axis direction. The cut pattern 112 may be formed along a direction which is oblique or substantially parallel to the x-axis direction. The cut pattern 112 extends from the gap 111 and is substantially parallel to the gap 111. The cut pattern 112 is connected to the apex 111p of the gap 111.

Referring to FIG. 6 to FIG. 8, the circuit board 1 according to the present exemplary embodiment includes the substrate 120 including the gap 111 of the conductive pattern 110, the substrate gap cut pattern 121, and the substrate cut pattern 122 corresponding to the cut pattern 112. The widths of the substrate gap cut pattern 121 and the substrate cut pattern 122 may be less than or equal to the width of the gap 111 of the conductive pattern 110 or the cut pattern 112.

Referring to FIG. 6 to FIG. 8, a width W1 of the conductive pattern 110 of the circuit board 1 may be less than or equal to the width W2 of the portion that is divided into the substrate gap cut pattern 121 and the substrate cut pattern 122 of the substrate 120, to prevent the conductive pattern 110 from being stripped, and the conductive pattern 110 that is not incised may be disposed in a region of the substrate 120 that is not incised.

Referring to FIG. 9, when the circuit board 1 is pulled in the y-axis direction, the cut pattern 112 and the substrate cut pattern 122 may be deformed, such as being expanded or widened, to extend the conductive pattern 110 and the substrate 120 in the y-axis direction. Therefore, the circuit board 1 may be substantially elongated without damaging the conductive pattern 110. The conductive pattern 110 and the corresponding substrate 120 may be deformed to bend with respect to the cut pattern 112 and the substrate cut pattern 122.

When the circuit board 1 is compressed in the y-axis direction, two portions of the conductive pattern 110 facing each other with respect to the cut pattern 112 and two portion of the substrate 120 facing each other with respect to the substrate cut pattern 122 may be deformed, such as being close to or overlapping each other, and the conductive pattern 110 and the substrate 120 may be compressed in the y-axis direction. Therefore, the circuit board 1 may be compressed without damaging the conductive pattern 110.

Referring back to FIG. 7, the cut pattern 112 and the corresponding substrate cut pattern 122 formed on the left side of the conductive pattern 110 may overlap with the cut pattern 112 and the corresponding substrate cut pattern 122 formed on the right side of the conductive pattern 110 in at least a part of the overlapping region (OV) in the y-axis direction. Accordingly, increasing the lengths of the cut pattern 112 and the substrate cut pattern 122 may increase a deformation range of the circuit board 1 in the y-axis direction and prevent the conductive pattern 110 from being damaged.

Referring to FIG. 10, when the circuit board 1 is pulled in the x-axis direction, the gap 111 between the conductive patterns 110 and the substrate gap cut pattern 121 of the substrate 120 may be increased to elongate the circuit board 1 in the x-axis direction. When the circuit board 1 is compressed in the x-axis direction, the gap 111 between the conductive patterns 110 and the substrate gap cut pattern 121 of the substrate 120 may be reduced, or the two portions of the conductive patterns 110 or the two portions of the substrate 120 facing each other with respect to the gap 111 may be deformed, such as being closer or overlapping each other, to compress the circuit board 1 in the x-axis direction.

When the circuit board 1 is pulled or compressed in an oblique direction that is different from the x-axis direction and the y-axis direction, the gap 111 of the conductive pattern 110, the cut pattern 112, the substrate gap cut pattern 121, and the substrate cut pattern 122 may be deformed, such as being widened or narrowed, to elongate or compress the circuit board 1.

A circuit board according to an exemplary embodiment of the present invention will be described below with reference to FIG. 11 to FIG. 21, together with the above-described drawings.

Figure 11:
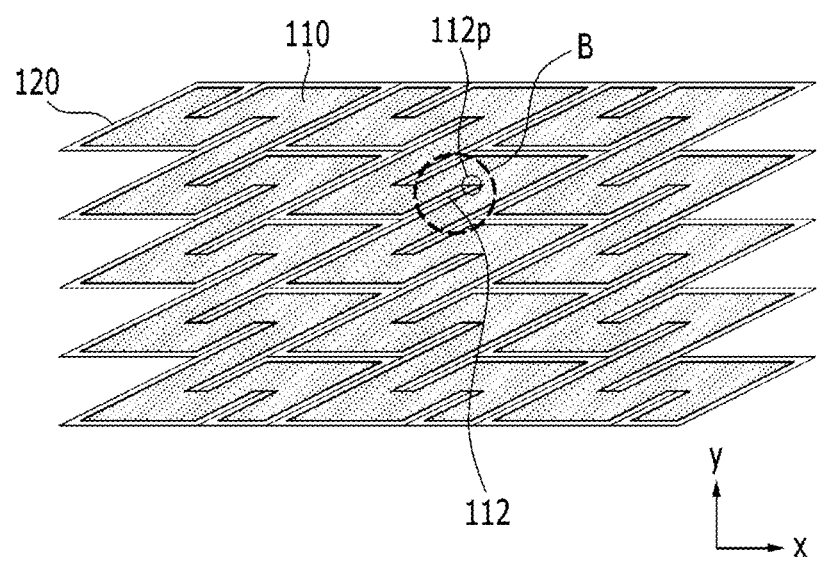
FIG. 11 shows a top plan view of a circuit board according to an exemplary embodiment of the present invention.
Figure 12:
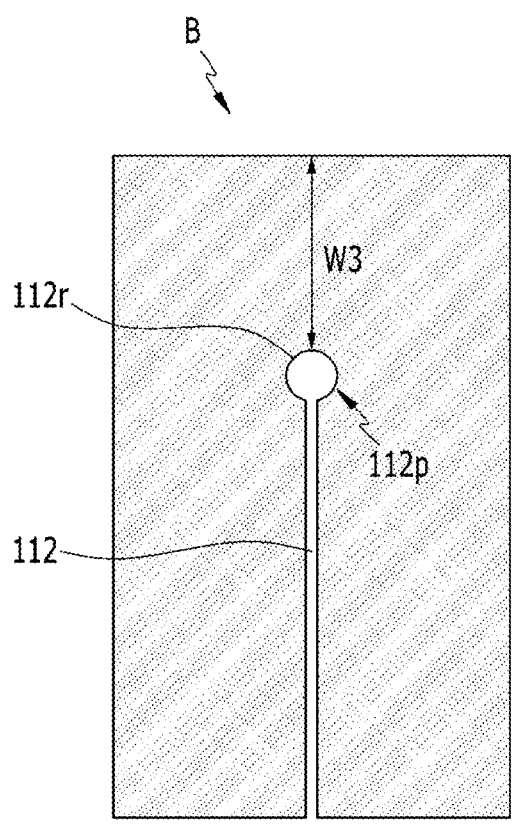
FIG. 12, FIG. 14, FIG. 16, FIG. 18, and FIG. 20 show enlarged views of portion B of FIG. 11 before the circuit board is elongated.

FIG. 11 shows a top plan view of a circuit board according to an exemplary embodiment of the present invention, FIG. 12, FIG. 14, FIG. 16, FIG. 18, and FIG. 20 show enlarged views of portion B before the circuit board shown in FIG. 11 is elongated, and FIG. 13, FIG. 15, FIG. 17, FIG. 19, and FIG. 21 show states of the circuit board shown in FIG. 12, FIG. 14, FIG. 16, FIG. 18, and FIG. 20, respectively, after the circuit board is elongated to the right and left.

According to the present exemplary embodiment, the cut pattern 112 of the conductive pattern 110 and the corresponding substrate cut pattern 122 of the substrate 120 may have various shapes. The conductive pattern 110 may be connected to the cut pattern 112 or further include a supplementary pattern. Repeated description of the substantially similar elements of the circuit board 1 illustrated with reference to FIG. 2 through FIG. 10 will be omitted.

For convenience of illustration, FIG. 12 to FIG. 21 show the cut pattern 112 of the conductive pattern 110, and the substrate cut pattern 122 of the substrate 120 may have the substantially similar forms and characteristics. Hereinafter, the cut pattern 112 of the conductive pattern 110 will be described, but the substantially similar features are applicable to the substrate cut pattern 122.

Referring to FIG. 11 and FIG. 12 to FIG. 15, a supplementary pattern includes a hole 112r formed in an end portion 112p that is not connected to the gap 111. The hole 112r may have a circular, oval, or polygonal shape. The supplementary pattern may reduce a distance from the end portion 112p of the cut pattern 112 to the adjacent cut pattern 112 or the gap 111. That is, a width W3 of the incised conductive pattern 110 may be reduced. Therefore, when the circuit board 1 is deformed, a width of a bent portion with respect to the cut pattern 112 of the conductive pattern 110 may be formed to be smaller to reduce the stress applied to the circuit board 1. Referring to FIG. 12 to FIG. 15, the stress applied to the circuit board 1 and to the adjacent conductive pattern 110 is reduced as the hole 112r becomes larger.

Referring to FIG. 11 and FIG. 16 to FIG. 19, the supplementary pattern includes a side cut pattern 113 disposed near the cut pattern 112. As shown in FIG. 16 to FIG. 19, the hole 112r is formed in the end portion 112p of the cut pattern 112.

The hole 112*r* may have different sizes according to the elongation of the circuit board 1.

The side cut pattern 113 is disposed near one corresponding cut pattern 112, and is extended towards the corresponding cut pattern 112 from a neighboring cut pattern 112*n*. However, the side cut pattern 113 may not meet the corresponding cut pattern 112, and a distance between the side cut pattern 113 and the corresponding cut pattern 112 may be determined in consideration of the elongation of the circuit board 1. The side cut pattern 113 may be linear or have a curved shape.

As shown in FIG. 16 to FIG. 19, the side cut pattern 113 may be formed on each side of the corresponding cut pattern 112, or on one side of the cut pattern 112.

Referring to FIG. 16 to FIG. 19, the supplementary pattern further includes an arch pattern 113*r* disposed near the end portion 112*p* of the cut pattern 112. As shown in FIG. 16 to FIG. 19, the hole 112*r* is formed in the end portion 112*p* of the cut pattern 112, and the hole 112*r* may have different sizes according to the elongation of the desired circuit board 1.

The arch pattern 113*r* is connected to an end portion of the side cut pattern 113 arranged near the corresponding cut pattern 112, and surrounds a portion of the end portion 112*p* of the cut pattern 112. As shown in FIG. 16 to FIG. 19, when a pair of side cut patterns 113 is disposed around the cut pattern 112, a pair of arch patterns 113*r* is disposed near the end portion 112*p* of the cut pattern 112. When one side cut pattern 113 is disposed near the cut pattern 112, one arch pattern 113*r* is formed near the end portion 112*p* of the cut pattern 112. The arch pattern 113*r* may have a linear or curved shape.

Figure 13:
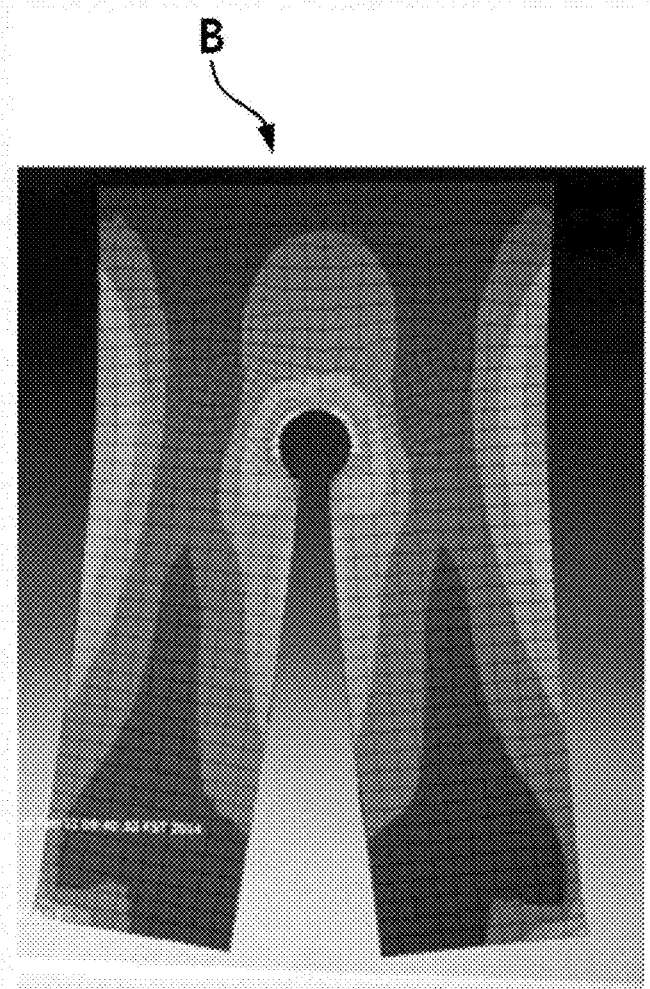
FIG. 13, FIG. 15, FIG. 17, FIG. 19, and FIG. 21 show states of the circuit board shown in FIG. 12, FIG. 14, FIG. 16, FIG. 18, and FIG. 20, respectively, after the circuit board is elongated to the right and left.
Figure 14:
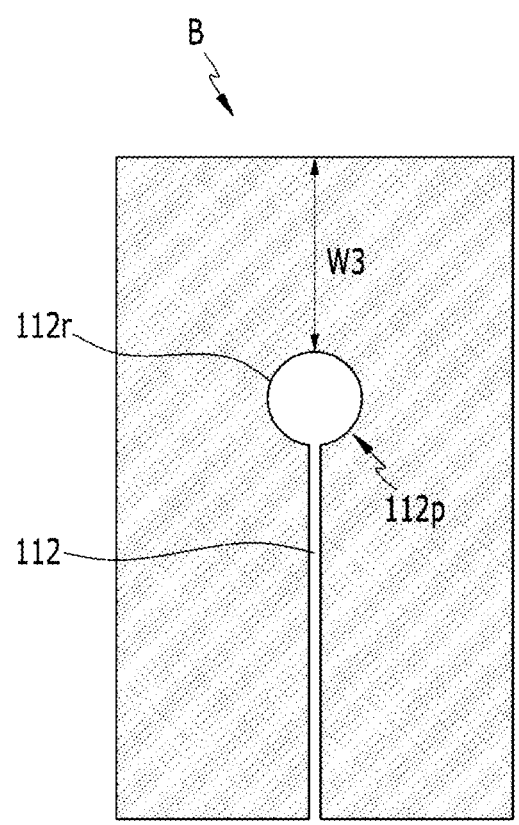
Figure 15:
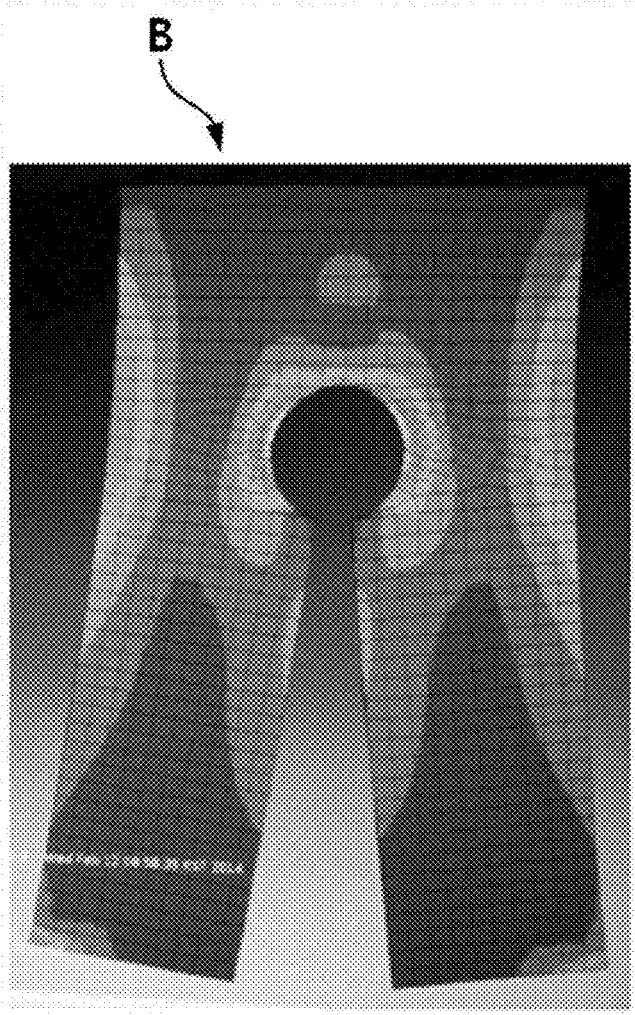
Figure 16:
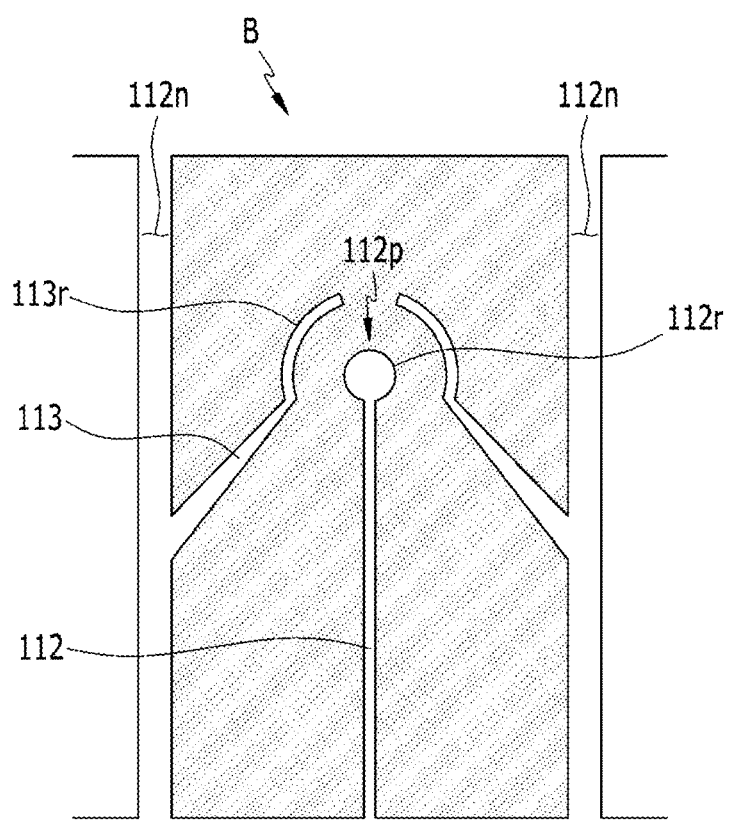
Figure 17:
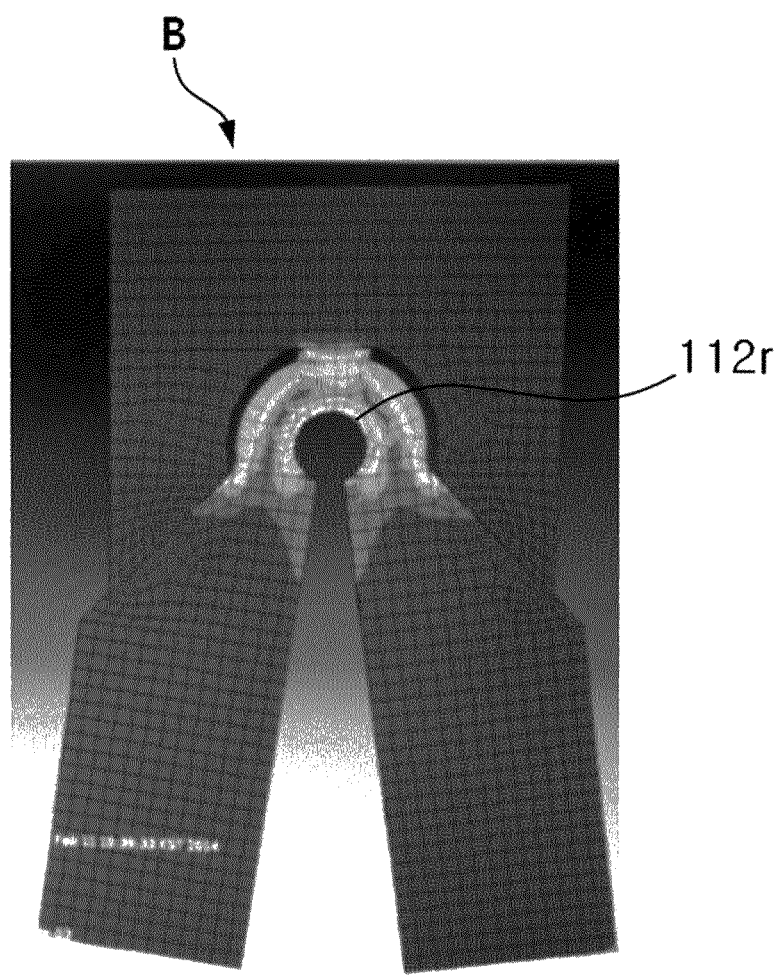
Figure 18:
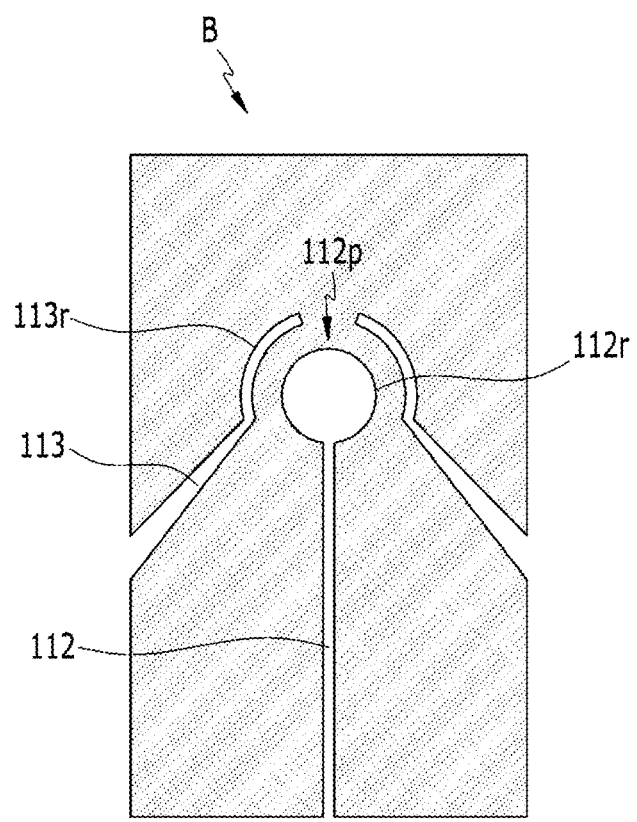
Figure 19:
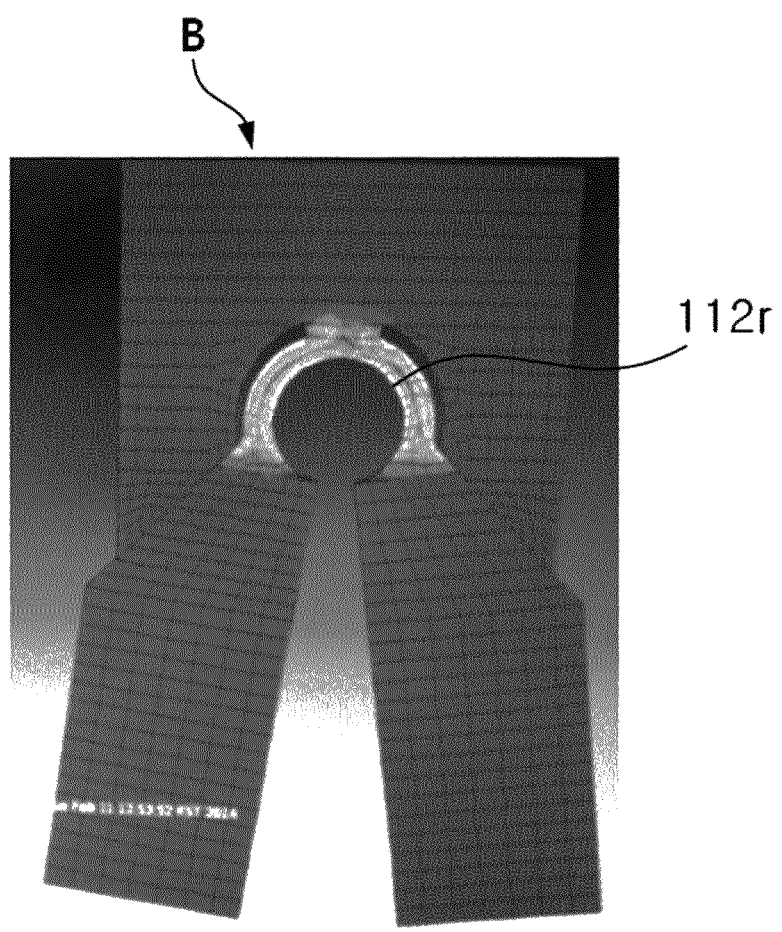

When the supplementary pattern such as the side cut pattern 113 and/or the arch pattern 113*r* is formed, the stress applied to the bent or deformed portion of the cut pattern 112 of the conductive pattern 110 may be reduced, and improves deformation characteristic of the circuit board 1. Particularly, an amount of the stress applied near the cut pattern 112 is reduced when the circuit board 1 is elongated, as shown in FIG. 17 and FIG. 19 compared to FIG. 13 and FIG. 15. When the circuit board 1 is stretched in the x-axis direction, a degree of the stress applied to the circuit board 1 including the side cut pattern 113 and the arch pattern 113*r*, as shown in FIG. 17 and FIG. 19, is less than a degree of the stress applied to the circuit board 1 not including the side cut pattern 113 or arch pattern 113*r*, as shown in FIG. 13 and FIG. 15. Further, when the hole 112*r* is formed, the stress applied to the circuit board 1 is reduced as the hole 112*r* becomes larger.

Figure 20:
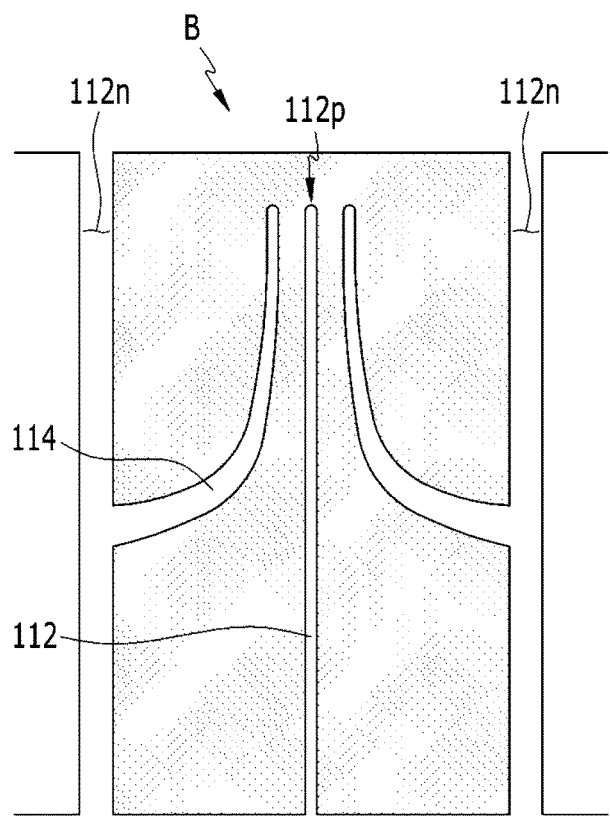
Figure 21:
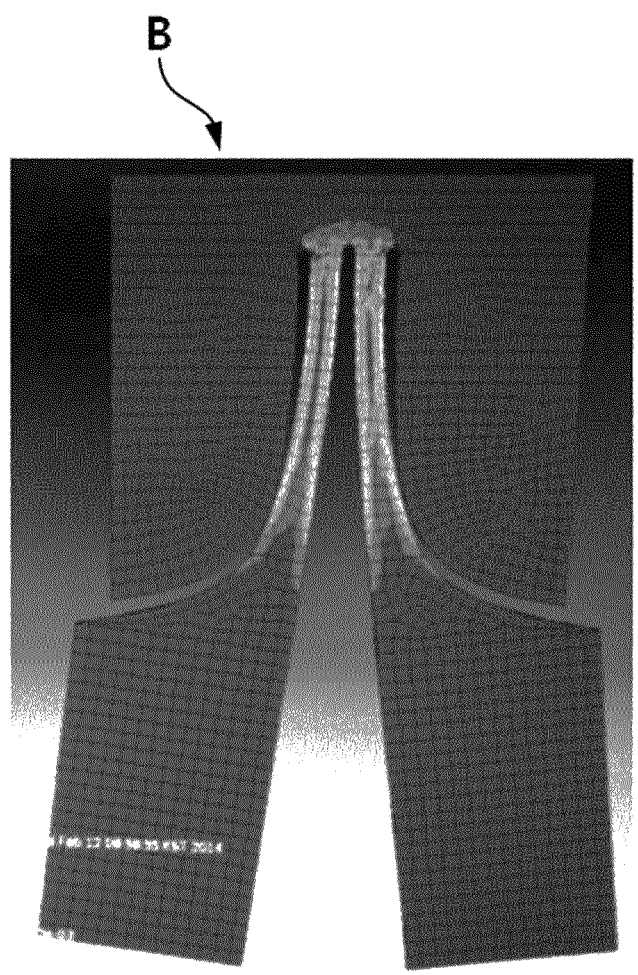

Referring to FIG. 11, FIG. 20, and FIG. 21, the supplementary pattern includes a side cut pattern 114 disposed near the cut pattern 112 according to an exemplary embodiment of the present invention. The side cut pattern 114 is disposed near a corresponding cut pattern 112, and extends towards the corresponding cut pattern 112 from the neighboring cut pattern 112*n*, and extends substantially parallel to the corresponding cut pattern 112. The side cut pattern 114 may not meet the corresponding cut pattern 112, and the distance between the side cut pattern 114 and the corresponding cut pattern 112 may be determined according to the elongation of the desired circuit board 1. The side cut pattern 114 may have a curved shape.

Referring to FIG. 21, when the circuit board 1 includes the supplementary pattern, such as the side cut pattern 114, a range of the elongated or deformed portion on the cut pattern 112 of the conductive pattern 110 may increase to reduce the applied stress and increase the reliability with respect to the deformation rate without damaging the circuit board 1.

A sensor according to an exemplary embodiment of the present invention will be described below with reference to FIG. 22 to FIG. 31 together with the above-described drawings.

Figure 22:
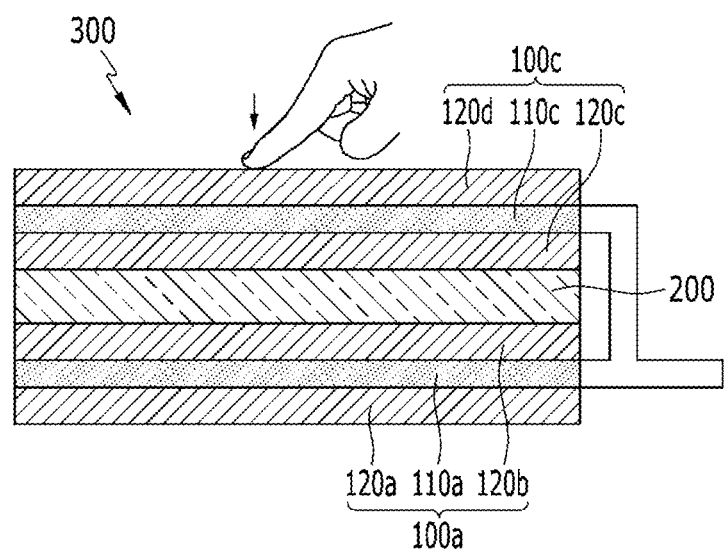
FIG. 22 shows a cross-sectional view of an electronic device including a circuit board according to an exemplary embodiment of the present invention.
Figure 23:
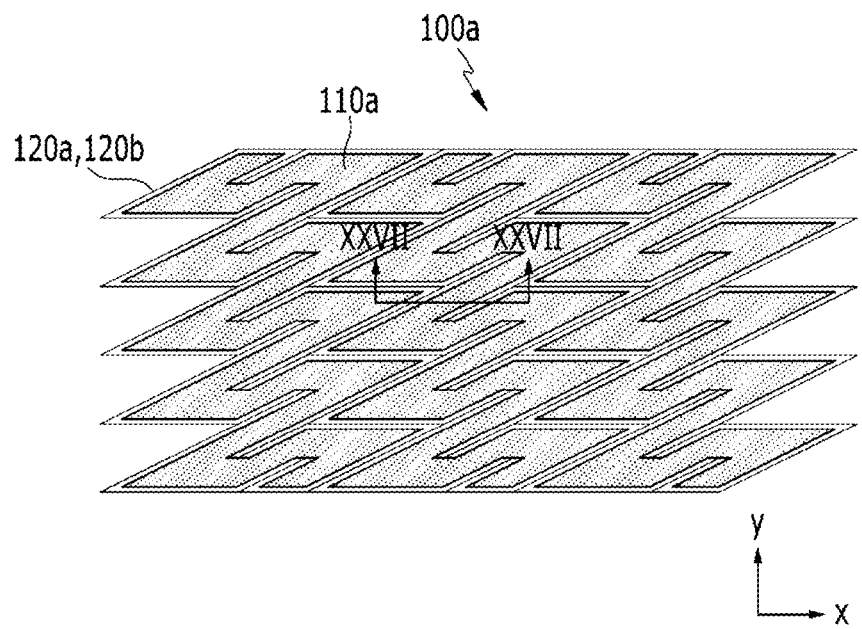
FIG. 23 shows a top plan view of the circuit board included in an electronic device shown in FIG. 22.
Figure 24:
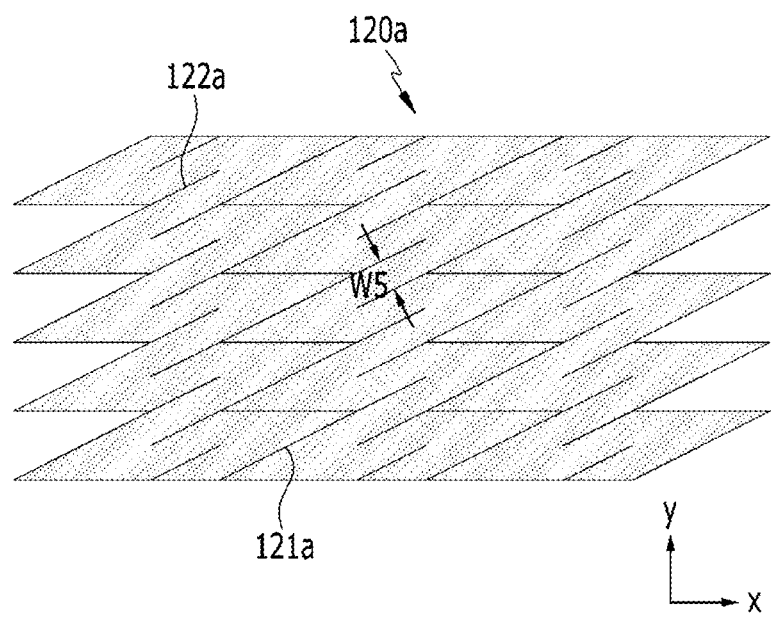
FIG. 24 shows a top plan view of an insulating layer of the circuit board shown in FIG. 23.
Figure 25:
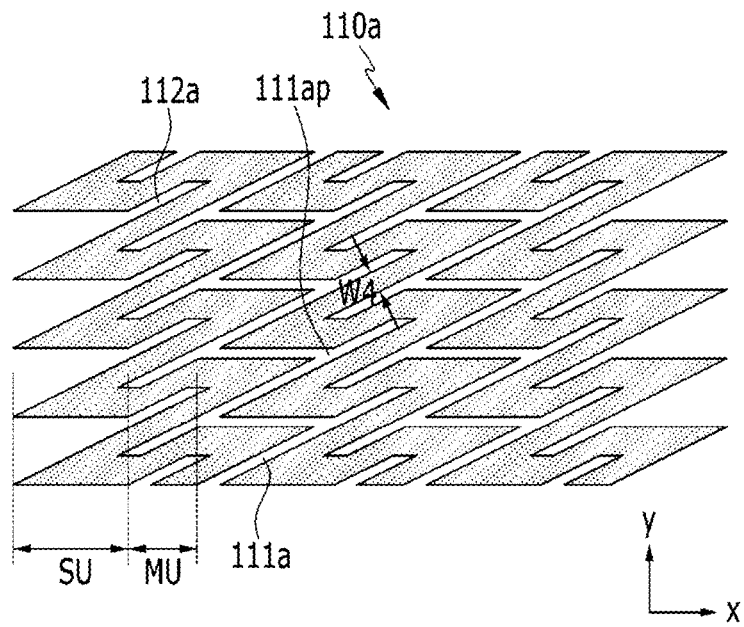
FIG. 25 shows a top plan view of a conductive pattern of the circuit board shown in FIG. 23.
Figure 26:
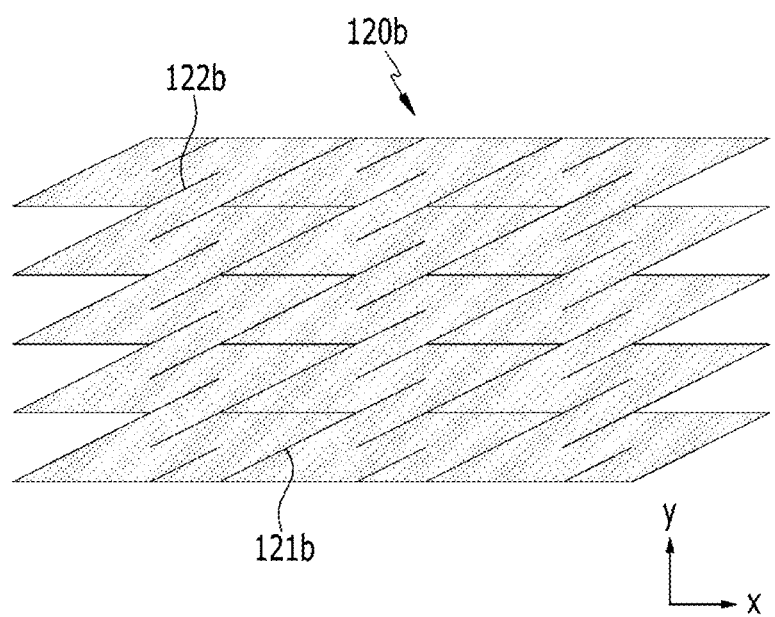
FIG. 26 shows a top plan view of an insulating layer of the circuit board shown in FIG. 23.
Figure 27:
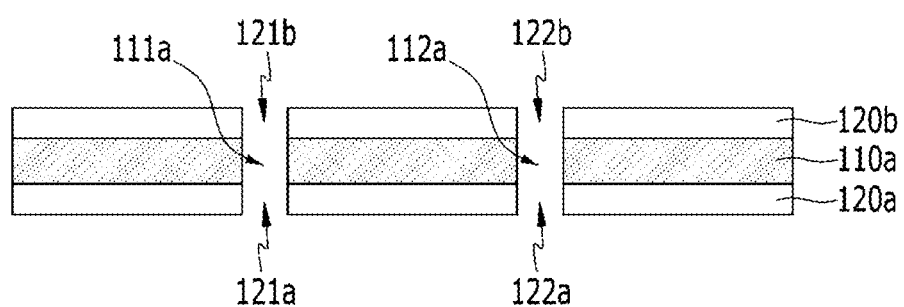
FIG. 27 shows a cross-sectional view of the circuit board of FIG. 23 with respect to line XXVII-XXVII.
Figure 28:
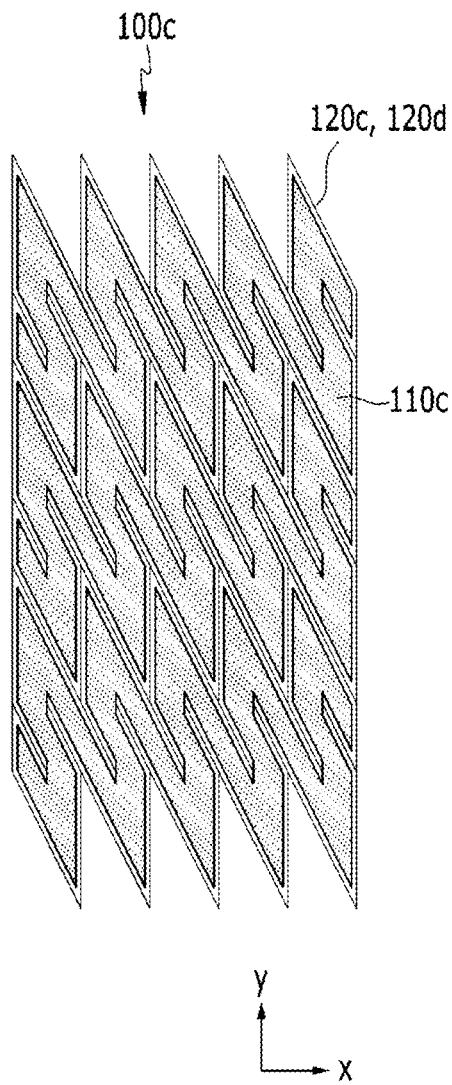
FIG. 28 shows a top plan view of the circuit board included in the electronic device shown in FIG. 22.
Figure 29:
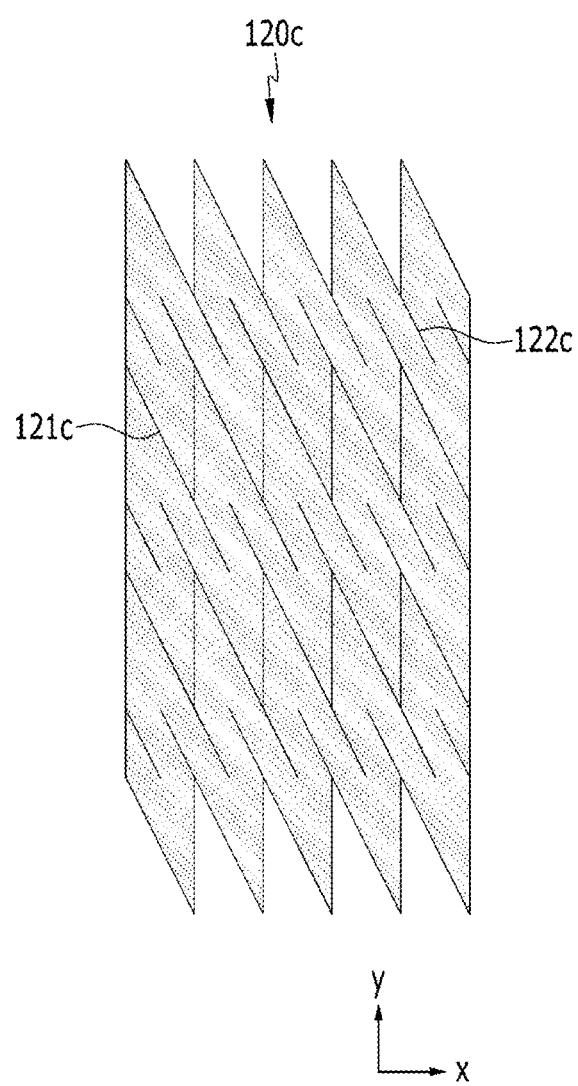
FIG. 29 shows a top plan view of an insulating layer of the circuit board shown in FIG. 28.
Figure 30:
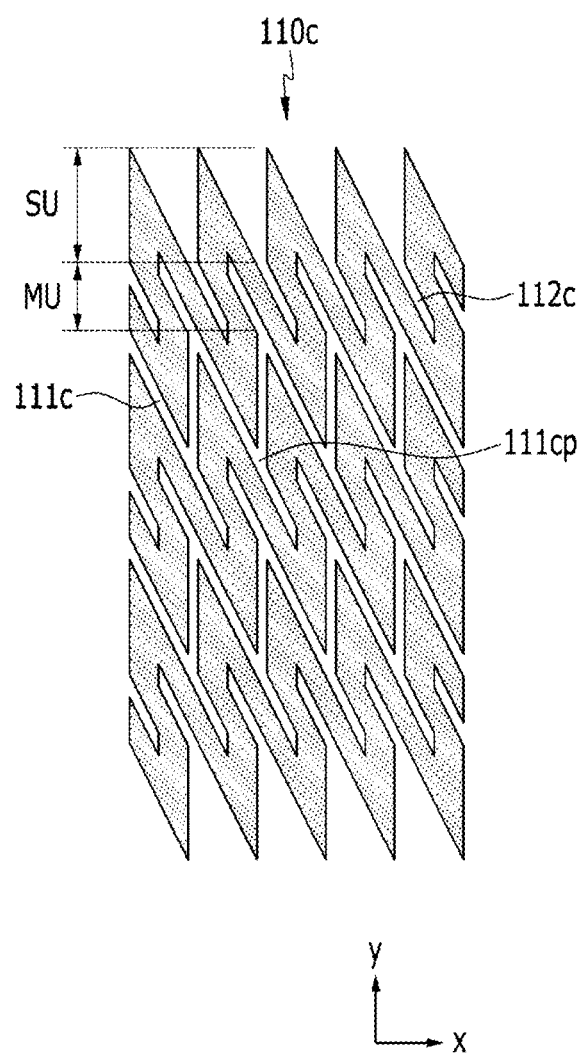
FIG. 30 shows a top plan view of a conductive pattern of the circuit board shown in FIG. 28.
Figure 31:
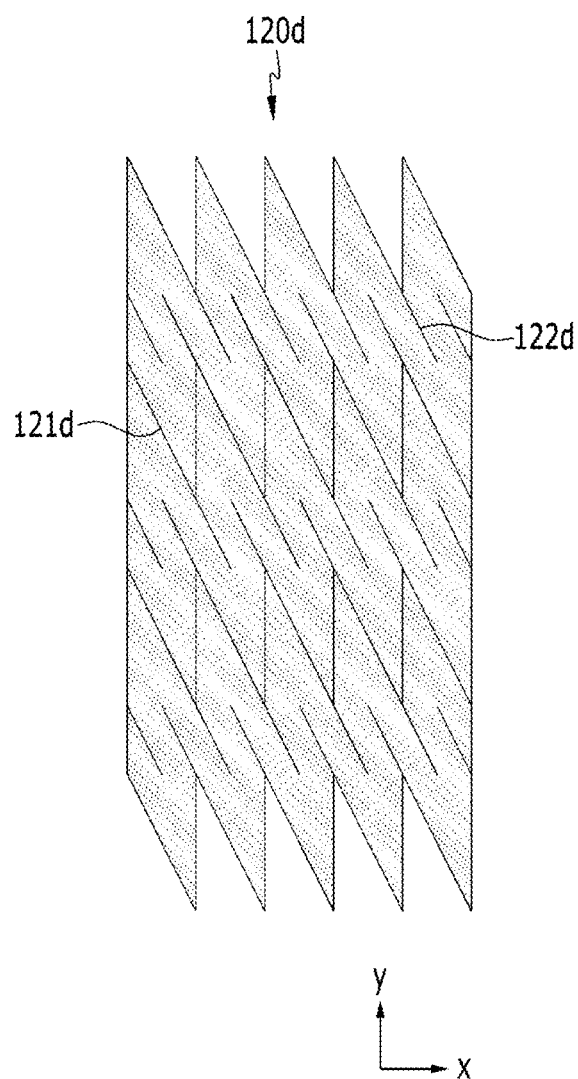
FIG. 31 shows a top plan view of an insulating layer of the circuit board shown in FIG. 28.

FIG. 22 shows a cross-sectional view of an electronic device including a circuit board according to an exemplary embodiment of the present invention. FIG. 23 shows a top plan view of the circuit board included in an electronic device shown in FIG. 22, and FIG. 24 shows a top plan view of an insulating layer of the circuit board shown in FIG. 23. FIG. 25 shows a top plan view of a conductive pattern of the circuit board shown in FIG. 23, and FIG. 26 shows a top plan view of an insulating layer of the circuit board shown in FIG. 23. FIG. 27 shows a cross-sectional view of the circuit board of FIG. 23 with respect to line XXVII-XXVII, and FIG. 28 shows a top plan view of the circuit board included in an electronic device shown in FIG. 22. FIG. 29 shows a top plan view of an insulating layer of the circuit board shown in FIG. 28, and FIG. 30 shows a top plan view of a conductive pattern of the circuit board shown in FIG. 28. FIG. 31 shows a top plan view of an insulating layer of the circuit board shown in FIG. 28.

Referring to FIG. 22, the sensor 300 including a circuit board is a pressure sensor for sensing a pressure applied by an external device. Particularly, the sensor 300 may be a flexible sensor for sensing a pressure from an insulator, such as a user's finger without using a stylus pen, and may be folded, rolled, or expanded in at least one direction.

The sensor 300 includes a first circuit board 100*a* and a second circuit board 100*c* facing each other, and an elastic layer 200.

The first circuit board 100*a*, the second circuit board 100*c*, or both the first circuit board 100*a* and the second circuit board 100*c* have a substantially similar structure as the circuit board 1 illustrated above with reference to FIG. 2 to FIG. 21.

The first circuit board 100*a* includes insulating layers 120*a* and 120*b*, and a conductive pattern 110*a* disposed therebetween. One of the insulating layer 120*a* and the insulating layer 120*b* may be the substrate 120 illustrated above with reference to FIG. 2 to FIG. 21, and the other is a cover-lay for protecting the conductive pattern 110. Another cover-lay may be attached to an external side of at least one of the insulating layer 120*a* and the insulating layer 120*b*.

The second circuit board 100*c* includes insulating layers 120*c* and 120*d* and a conductive pattern 110*c* disposed therebetween. One of the insulating layer 120*c* and the insulating layer 120*d* may be the substrate 120 illustrated above with reference to FIG. 2 to FIG. 21, and the other is a cover-lay for protecting the conductive pattern 110. Another cover-lay may be attached to an external side of at least one of the insulating layer 120*c* and the insulating layer 120*d*.

A pressure reduces a thickness of the elastic layer 200 which includes silicon and various kinds of organic materials.

Referring to FIG. 23 to FIG. 27, a conductive pattern 110*a* of the first circuit board 100*a* corresponds to the conductive pattern 110 according to the exemplary embodiment described with reference to FIG. 2 to FIG. 21, and the insulating layers 120*a* and 120*b* corresponds to the substrate 120 or the cover-lay. Particularly, FIG. 23 to FIG. 26 illustrates a conductive pattern 110*a* and insulating layers 120*a* and 120*b* that are substantially similar to the conductive pattern 110 and the substrate 120 of the exemplary embodiment illustrated with reference to FIG. 6 to FIG. 21.

Referring to FIG. 25, conductive patterns 110a are arranged in the x-axis direction, and the conductive patterns 110a respectively include a main body (MU) and a sub-body (SU) substantially extended in the y-axis direction. A gap 111a is disposed between the neighboring conductive patterns 110a. The gap 111a between the conductive patterns 110a includes an apex 111ap that is arranged in a point nearest to the main body (MU) from the gap 111a. As shown in FIG. 25, the conductive pattern 110a includes a cut pattern 112a connected to the gap 111a and formed inside the main body (MU). The cut pattern 112a may be connected to the apex 111ap of the gap 111a.

Referring to FIG. 24 and FIG. 27, the insulating layer 120a includes a substrate gap cut pattern 121a and a substrate cut pattern 122a corresponding to the gap 111a of the conductive pattern 110a and the cut pattern 112a, respectively.

Referring to FIG. 26 and FIG. 27, the insulating layer 120b includes a substrate gap cut pattern 121b and a substrate cut pattern 122b corresponding to the gap 111a of the conductive pattern 110a and the cut pattern 112a, respectively. The insulating layer 120a may have a shape substantially similar to the insulating layer 120b.

Referring to FIG. 24 and FIG. 25, widths of the substrate gap cut pattern 121a and the substrate gap pattern 122a of the insulating layer 120a may be less than or equal to a width of the gap 111a of the conductive pattern 110a or the cut pattern 112a. That is, a width W4 of the conductive pattern 110a may be less than or equal to a width W5 of a portion that is divided by the substrate gap cut pattern 121a and the substrate cut pattern 122a of the insulating layer 120a in order to prevent the conductive pattern 110a from being stripped off. The conductive pattern 110a that is not incised may be formed on a region of the insulating layer 120a that is not incised. Widths of the substrate gap cut pattern 121b and the substrate cut pattern 122b of the insulating layer 120b may be less than or equal to a width of the gap 111a of the conductive pattern 110a or the cut pattern 112a, and the conductive pattern 110a that is not incised may be formed on a regions of the insulating layer 120 b that is not incised.

When the sensor 300 is pulled or compressed in the y-axis direction, the cut pattern 112a and the substrate cut patterns 122a and 122b may be opened or deformed, and the conductive pattern 110a and the insulating layers 120a and 120b may be increased or reduced in the y-axis direction. When the sensor 300 is pulled or compressed in the x-axis direction, the gap 111a of the conductive patterns 110a and the substrate gap cut patterns 121a and 121b of the insulating layers 120a and 120b may be opened or deformed, and the conductive pattern 110a and the insulating layers 120a and 120b may be increased or reduced in the x-axis direction. When the sensor 300 is pulled or compressed in an oblique direction that is different from the x-axis direction and the y-axis direction, the gap 111a of the conductive pattern 110a, the cut pattern 112a, the substrate gap cut patterns 121a and 121b, and the substrate cut patterns 122a and 122b of the insulating layers 120a and 120b may be deformed, such as opened or reduced, and the sensor 300 may be elongated or compressed.

Referring to FIG. 28 to FIG. 31, the second circuit board 100c is rotated 90 degrees in a clockwise direction or a counterclockwise direction with respect to the first circuit board 100a illustrated with reference to FIG. 27.

Referring to FIG. 30, conductive patterns 110c are arranged in the y-axis direction, and each of the conductive patterns 110c includes a main body (MU) and a sub-body (SU) substantially extended in the x-axis direction. A gap 111c is disposed between the neighboring conductive patterns 110c. The gap 111c between the conductive patterns 110c includes an apex 111cp which is arranged in a point nearest to the main body (MU) from the gap 111c. The conductive pattern 110c includes a cut pattern 112c connected to the gap 111c and formed inside the main body (MU). The cut pattern 112c is connected to the apex 111cp of the gap 111c.

Referring to FIG. 29, an insulating layer 120c includes a substrate gap cut pattern 121c and a substrate cut pattern 122c corresponding to the gap 111c of the conductive pattern 110c and the cut pattern 112c, respectively.

Referring to FIG. 31, an insulating layer 120d includes a substrate gap cut pattern 121d, a substrate cut pattern 122d corresponding to the gap 111c of the conductive pattern 110c, and the cut pattern 112c, respectively. The shape of the insulating layer 120d and the insulating layer 120c may be substantially similar.

Widths of the substrate gap cut pattern 121c and the substrate cut pattern 122c of the insulating layer 120c may be less than or equal to the gap 111c of the conductive pattern 110c or the width of the cut pattern 112c. The width of the conductive pattern 110c may be less than or equal to the width of the portion that is divided by the substrate gap cut pattern 121c and the substrate cut pattern 122c of the insulating layer 120c in order to prevent the conductive pattern 110c from being stripped off, and the conductive pattern 110c that is not incised may be disposed in a region of the insulating layer 120c that is not incised. Widths of the substrate gap cut pattern 121d and the substrate cut pattern 122d of the insulating layer 120d may be less than or equal to the gap 111c of the conductive pattern 110c or the width of the cut pattern 112c, and the conductive pattern 110c that is not incised may be disposed in a region of the insulating layer 120d that is not incised.

When the sensor 300 is pulled or compressed in the x-axis direction, the cut pattern 112c and the substrate cut patterns 122c and 122d may be opened or deformed, and the conductive pattern 110c and the insulating layers 120c and 120d may be increased or reduced in the x-axis direction. When the sensor 300 is pulled or compressed in the y-axis direction, the gap 111c between the conductive patterns 110c, and the substrate gap cut patterns 121c and 121d of the insulating layers 120c and 120d, may be opened or deformed, and the conductive pattern 110c and the insulating layers 120c and 120d may be increased or reduced in the y-axis direction. When the sensor 300 is pulled or compressed in the oblique direction that is different from the x-axis direction and the y-axis direction, the gap 111c of the conductive pattern 110c, the cut pattern 112c, the substrate gap cut patterns 121c and 121d, and the substrate cut patterns 122c and 122d of the insulating layers 120c and 120d may be deformed, such as opened or reduced, and the sensor 300 may be elongated or compressed.

A conductive pattern 110a of the first circuit board 100a may overlap conductive patterns 110c of the second circuit board 100c. The overlapping region may be reduced when the conductive pattern 110a or the conductive pattern 110c deviates in the x- or y-axis direction from a point of the overlapping region, which reduces a density of the overlapping region.

When the sensor 300 is applied with an external pressure, the pressure is transmitted to the elastic layer 200 and reduces a thickness of the elastic layer 200 corresponding to a touched position and changes a capacitance between the conductive pattern 110a and the conductive pattern 110c. The sensor 300 may obtain information of the touched position and the pressure intensity by sensing a change of the capacitance.

When the density of the region in which the conductive pattern 110a overlaps the conductive pattern 110c reduces in the x-axis direction, the y-axis direction, or radially, the thickness of the corresponding elastic layer 200 for the two planar neighboring conductive patterns 110a or the two planar neighboring conductive patterns 110c changes which may change the corresponding capacitance. Accordingly, more detailed information of the touched position and pressure intensity may be obtained according to the present exemplary embodiment.

Figure 32:
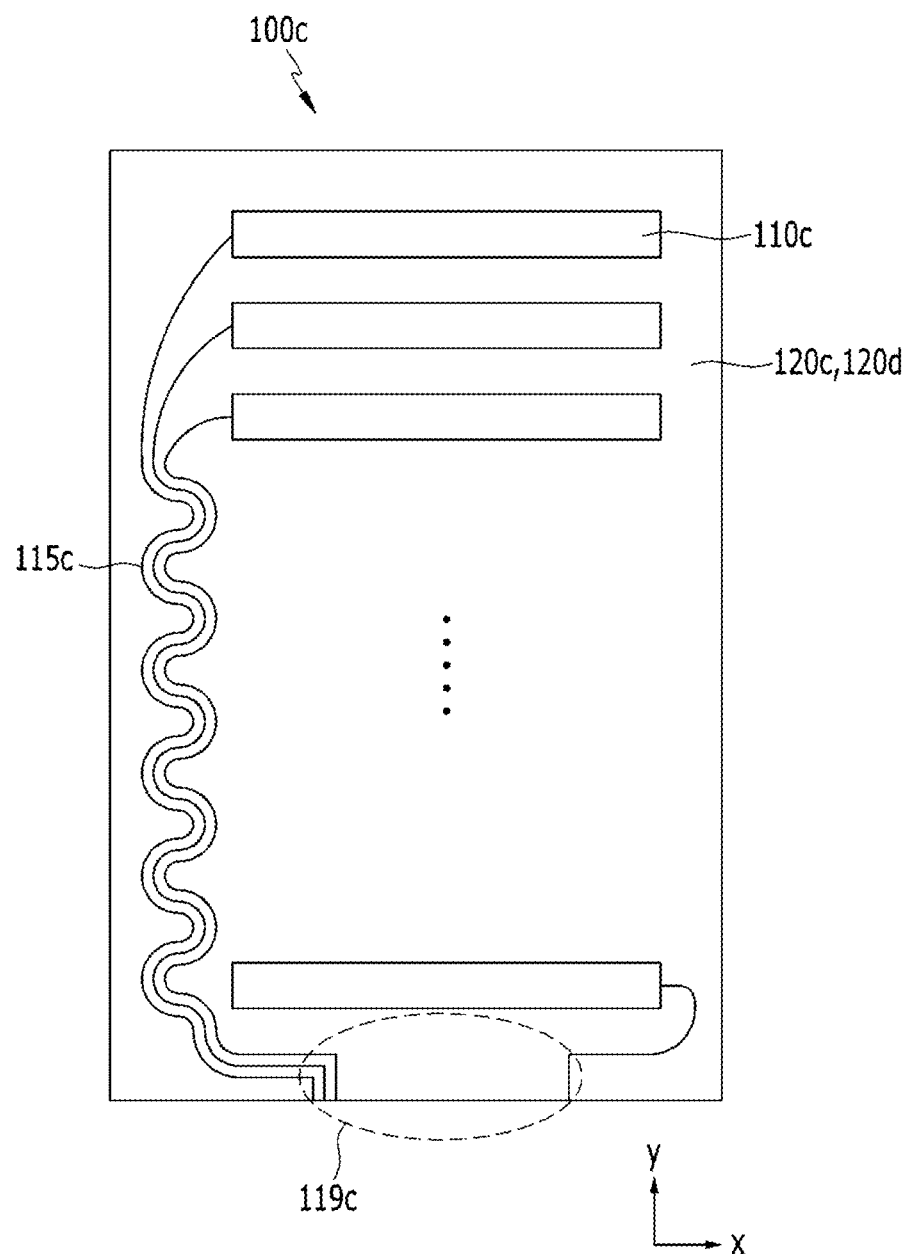
FIG. 32 shows a layout of a circuit board included in an electronic device according to an exemplary embodiment of the present invention.

FIG. 32 shows a layout view of an electronic device including a circuit board according to an exemplary embodiment of the present invention.

Referring to FIG. 32, the second circuit board 100c of the sensor 300 includes a pad 119c for accessing a driving circuit chip or another circuit board, and the conductive pattern 110c is connected to the pad 119c through a connection wire 115c. The connection wire 115c is disposed near a touch sensing region in which the conductive pattern 110c is arranged. The connection wire 115c is disposed between the insulating layers 120c and 120d in a like manner of the conductive pattern 110c, and is disposed on a same layer with a same material as the conductive pattern 110c. The connection wire 115c may be serpentine which prevents generation of faults such as stripping off or cracking of the connection wire 115c when the sensor 300 is deformed, and improves deformation characteristics of the sensor 300, such as elongation.

An electronic device including a sensor 300 according to an exemplary embodiment of the present invention will be described below with reference to FIG. 33 to FIG. 35.

Figure 33:
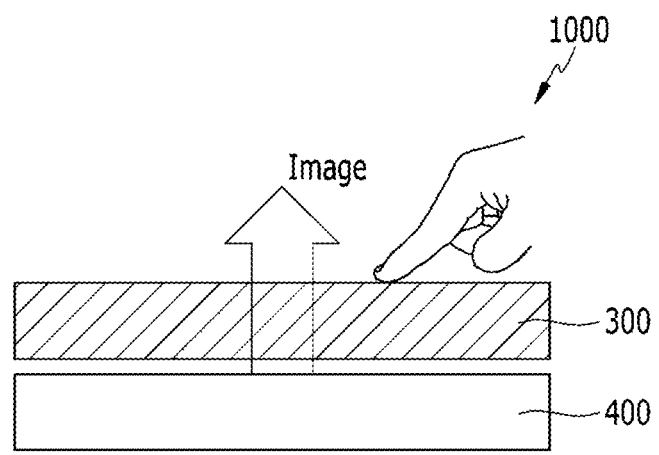
FIG. 33 and FIG. 34 show cross-sectional views of an electronic device according to an exemplary embodiment of the present invention.
Figure 34:
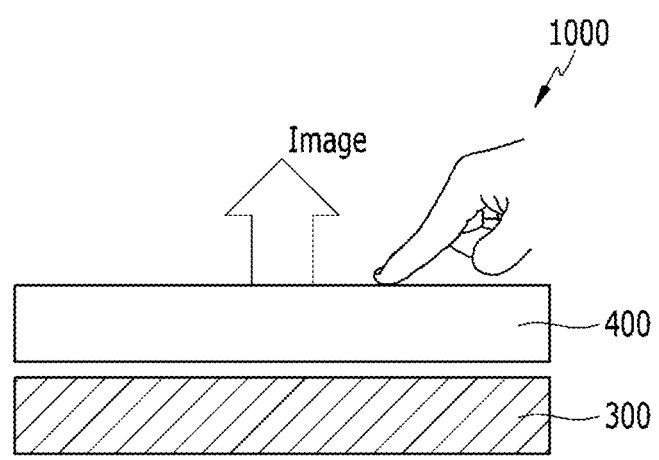
Figure 35:
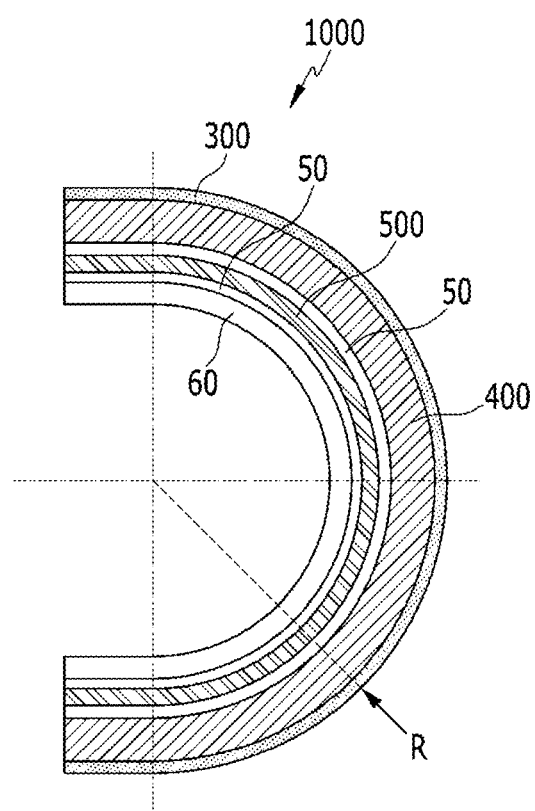
FIG. 35 shows a cross-sectional view of a bent or folded electronic device according to an exemplary embodiment of the present invention.

FIG. 33 and FIG. 34 show cross-sectional views of an electronic device according to an exemplary embodiment of the present invention, and FIG. 35 shows a cross-sectional view of a bent or folded electronic device according to an exemplary embodiment of the present invention.

Referring to FIG. 33 and FIG. 34, the electronic device 1000 includes a sensor 300 and a display panel 400 as a display device. The sensor 300 has a substantially similar configuration as described above, and repeated description of the substantially similar elements and operations of the sensor 300 will be omitted.

As shown in FIG. 33, when the sensor 300 is disposed on a front side of the display panel 400 for displaying an image, the sensor 300 may include a light transmissive material. The conductive pattern may include a transparent conductive material, such as indium tin oxide (ITO), indium zinc oxide (IZO), silver nanowire (AgNW), carbon nanotubes, or graphene.

Referring to FIG. 34, the sensor 300 is disposed on a rear side of the display panel 400. A conductive pattern of the sensor 300 may include an opaque conductive material with excellent conductivity or a transparent conductive material such as ITO.

Referring to FIG. 35, the electronic device 1000 includes a display panel 400, a touch panel 500 disposed on the display panel 400, a cover window 60 disposed on the touch panel 500, and a sensor 300 disposed below the display panel 400 as a display device. An adhesive 50 such as optically clear adhesive (OCA) may be disposed between the constituent elements. The electronic device 1000 may further include at least one optical film, such as a phase difference film or a polarization film.

The display panel 400 may be a liquid crystal panel including pixels and displaying images, or a panel including organic light emitting diodes.

The touch panel 500 is disposed on the display panel 400 and senses a contact position from an external contact, such as a user's finger or a pen. The touch panel 500 may operate by a capacitance method. The touch panel 500 may include conductive patterns for transmitting electrical signals.

The cover window 60 includes a displaying window for exposing a display area or a touch sensing region. The cover window 60 may be a film type.

The electronic device 1000 maintains flat as shown in FIG. 33 and FIG. 34 in the normal condition, and may be bent with a curvature radius (R) or substantially folded as shown in FIG. 35. The electronic device 1000 is a flexible device that may be foldable, flexible, stretchable, or rollable. As shown in FIG. 35, a curvature center is provided on the front side of the display panel 400 on which the images are displayed or the rear side thereof.

As shown in FIG. 35, when the curvature center is provided on the front side of the display panel 400, the sensor 300 arranged at the outermost part of the electronic device 1000 may have a high elongation rate and receive the greatest stress. Accordingly, when the electronic device 1000 is repeatedly folded or bent, the sensor 300 may repeatedly receive the great stress. The sensor 300 according to the exemplary embodiment of the present invention has high elongation, and may be deformed without generating faults, such as stripping off or cracking of the conductive pattern, thereby maintaining reliability.

When the curvature center is provided on the rear side of the display panel 400, the sensor 300 arranged at the innermost part of the electronic device 1000 may receive a great compressing stress. The sensor 300 according to the exemplary embodiment of the present invention has a structure that resists high compression in a like manner of the above-described exemplary embodiments, and may be deformed without stripping off or cracking of the conductive pattern, thereby maintaining reliability.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A circuit board, comprising:
   a substrate; and
   conductive patterns disposed inside or on the substrate, wherein:
   the conductive patterns comprise a first conductive pattern, a second conductive pattern, and a gap extending in a first direction and separating adjacent first and second conductive patterns from each other;
   the first conductive pattern comprises a plurality of first cut patterns different from the gap, connected to the gap, and extending toward an inside of the first conductive pattern, the first cut pattern ending inside the first conductive pattern such that the first cut pattern does not entirely separate the first conductive pattern into two parts;
   the first conductive pattern includes a first edge and a second edge opposing each other;

a portion of the plurality of first cut patterns are disposed at and along the first edge, and another portion of the plurality of first cut patterns are disposed at and along the second edge; and the first cut patterns disposed at the first edge and the first cut patterns disposed at the second edge are alternately arranged in the first direction.

2. The circuit board of claim 1, wherein
the plurality of first cut patterns are arranged along the first direction.

3. The circuit board of claim 2, wherein the first cut pattern extends in an oblique direction with respect to a second direction perpendicular to the first direction.

4. The circuit board of claim 3, wherein at least a portion of two neighboring first cut patterns of the plurality of first cut patterns overlap each other in the first direction.

5. The circuit board of claim 1, wherein the substrate comprises a plurality of substrate cut patterns corresponding to the plurality of first cut patterns.

6. The circuit board of claim 5, wherein the substrate further comprises a substrate gap cut pattern corresponding to the gap.

7. The circuit board of claim 1, wherein the first conductive pattern further comprises a main body extending in the first direction and sub-bodies connected to the main body, the first direction being a direction along which the gap substantially extends.

8. The circuit board of claim 7, wherein the plurality of first cut patterns are connected to an apex of the gap, the apex being a closest point to the main body from the gap.

9. The circuit board of claim 1, wherein the first conductive pattern further comprises a second cut pattern connected to a first cut pattern of the plurality of first cut patterns or disposed near the first cut pattern.

10. The circuit board of claim 9, wherein
the second cut pattern comprises a hole disposed at an end portion of the first cut pattern.

11. The circuit board of claim 9, wherein
the second cut pattern comprises a side cut pattern disposed near the first cut pattern and connected to a second cut pattern of the second conductive pattern.

12. An electronic device, comprising:
a first circuit board and a second circuit board facing each other; and
an elastic layer disposed between the first circuit board and the second circuit board,
wherein:
the first circuit board comprises a first substrate and conductive patterns disposed inside or on the first substrate;
the conductive patterns of the first circuit board comprise a first conductive pattern, a second conductive pattern, and a first gap extending in a first direction and separating adjacent first and second conductive patterns from each other;
the first conductive pattern comprises a plurality of first cut patterns different from the first gap, connected to the first gap, and extending toward an inside of the first conductive pattern, the first cut pattern ending inside the first conductive pattern such that the first cut pattern does not entirely separate the first conductive pattern into two parts;

the first conductive pattern includes a first edge and a second edge opposing each other;

a portion of the plurality of first cut patterns are disposed at and along the first edge, and another portion of the plurality of first cut patterns are disposed at and along the second edge; and the first cut patterns disposed at the first edge and the first cut patterns disposed at the second edge are alternately arranged in the first direction.

13. The electronic device of claim 12, wherein
the plurality of first cut patterns are arranged along the first direction.

14. The electronic device of claim 12, wherein
the first substrate comprises a plurality of substrate cut patterns corresponding to the plurality of first cut patterns.

15. The electronic device of claim 14, wherein
the first substrate further comprises a substrate gap cut pattern corresponding to the first gap.

16. The electronic device of claim 12, wherein:
the second circuit board comprises a second substrate and the conductive patterns disposed inside or on the second substrate;
the conductive patterns of the second circuit board comprise a third conductive pattern, a fourth conductive pattern, and a second gap that entirely separates adjacent third and fourth conductive pattern from each other; and
the first conductive pattern extends in a direction substantially orthogonal to a direction in which the third conductive pattern extends.

17. The electronic device of claim 16, wherein
the third conductive pattern comprises a plurality of second cut patterns connected to the second gap and extending toward an inside of the third conductive pattern.

18. The electronic device of claim 16, wherein:
the first conductive pattern comprises a first main body extending substantially in the first direction and first sub-bodies connected to the first main body,
the third conductive pattern comprises a second main body extending substantially in a second direction and second sub-bodies connected to the second main body; and
the first direction is substantially orthogonal to the second direction.

19. The electronic device of claim 18, wherein
the plurality of first cut patterns are connected to an apex of the first gap, the apex being a closest point to the first main body from the first gap.

20. The electronic device of claim 12, wherein the first conductive pattern further comprises a second cut pattern connected to a first cut pattern of the plurality of first cut patterns or disposed near the first cut pattern.

* * * * *